United States Patent
Hayashi et al.

(10) Patent No.: US 8,124,212 B2
(45) Date of Patent: Feb. 28, 2012

(54) SPUTTERING TARGET AND MANUFACTURING METHOD THEREFOR, AND RECORDABLE OPTICAL RECORDING MEDIUM

(75) Inventors: Yoshitaka Hayashi, Yokohama (JP); Noboru Sasa, Kawasaki (JP); Toshishige Fujii, Yokohama (JP); Masayuki Fujiwara, Yokohama (JP); Hiroshi Miura, Sendai (JP); Masaki Kato, Sagamihara (JP); Takeshi Kibe, Isehara (JP); Shinya Narumi, Yokohama (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 12/971,327

(22) Filed: Dec. 17, 2010

(65) Prior Publication Data

US 2011/0143075 A1 Jun. 16, 2011

Related U.S. Application Data

(62) Division of application No. 11/713,513, filed on Mar. 1, 2007, now Pat. No. 7,897,535.

(30) Foreign Application Priority Data

Mar. 1, 2006 (JP) .................................. 2006-055120
Aug. 4, 2006 (JP) .................................. 2006-213972

(51) Int. Cl.
*B32B 3/02* (2006.01)
(52) U.S. Cl. .................. 428/64.1; 428/64.4; 430/270.12
(58) Field of Classification Search .......................... None
See application file for complete search history.

(56) References Cited

U.S. PATENT DOCUMENTS

| 7,488,526 | B2 * | 2/2009 | Hayashi et al. | 428/64.4 |
| 2004/0037203 | A1 | 2/2004 | Harigaya et al. | |
| 2005/0207331 | A1 | 9/2005 | Shinkai et al. | |
| 2006/0222810 | A1 * | 10/2006 | Hayashi et al. | 428/64.4 |
| 2008/0138563 | A1 * | 6/2008 | Shibata et al. | 428/98 |
| 2009/0197117 | A1 * | 8/2009 | Sasa et al. | 428/698 |
| 2010/0003446 | A1 * | 1/2010 | Hayashi et al. | 428/64.4 |

FOREIGN PATENT DOCUMENTS

| EP | 1372148 A2 | 12/2003 |
| EP | 1566801 A1 | 8/2005 |
| JP | 59-8618 | 1/1984 |
| JP | 63-162533 | 7/1988 |
| JP | 5-169819 | 7/1993 |
| JP | 11-92922 | 4/1999 |
| JP | 2003-48375 | 2/2003 |
| JP | 2005-108396 | 4/2005 |
| JP | 2005-161831 | 6/2005 |
| JP | 2005-264206 | 9/2005 |
| JP | 2006-247897 | 9/2006 |
| JP | 2006-248177 | * 9/2006 |
| TW | 460598 | 10/2001 |
| TW | 226907 | 1/2005 |
| TW | 200521258 | 7/2005 |

OTHER PUBLICATIONS

Jan. 9, 2009 Chinese official action (and English translation thereof) in connection with a Counterpart Chinese patent application No. 2007100856089.
Jul. 23, 2010 Taiwanese official action (including English translation) in connection with counterpart Taiwanese patent application.
Nov. 22, 2010 Indian official action in connection with a counterpart Indian patent application.
Machine translation of JP 2005-264206.
Jul. 12, 2011 Japanese official action in connection with a counterpart Japanese patent application.

* cited by examiner

*Primary Examiner* — Elizabeth Mulvaney
(74) *Attorney, Agent, or Firm* — Cooper & Dunham LLP

(57) ABSTRACT

To provide a sputtering target for preparing a recordable optical recording medium characterized by comprising Bi and B and a manufacturing method thereof, a recordable high density optical recording medium using the sputtering target, and a sputtering target which is capable of improving a speed of the film formation for the improvement of productivity, which has a high intensity at the time of the film formation and which has a heightened packing density.

15 Claims, 7 Drawing Sheets ated Mar. 1, 2007, now U.S. Pat. No. 7,897,535, issued Mar. 1, 2011, the entire contents of which are incorporated herein by reference.

SPUTTERING TARGET AND MANUFACTURING METHOD THEREFOR, AND RECORDABLE OPTICAL RECORDING MEDIUM

CROSS-REFERENCE TO RELATED APPLICATION

This application is a divisional of U.S. application Ser. No. 11/713,513, filed Mar. 1, 2007, now U.S. Pat. No. 7,897,535, issued Mar. 1, 2011, the entire contents of which are incorporated herein by reference.

BACKGROUND

1. Technical Field

This disclosure relates to a sputtering target and a manufacturing method thereof, the target being used for forming a film of an oxide layer which is a constitution layer of a recordable optical recording medium. Further, this disclosure relates to a recordable optical recording medium manufactured by using the sputtering target, in particular, a recordable optical recording medium which enables a high density recording even in a blue laser wavelength area.

2. Description of the Related Art

In order to provide a recordable optical recording medium which enables recording and reproduction using a laser beam with a wavelength the same or less than that of a blue laser beam, extensive development is underway for blue laser beams which enable ultra-high density recording, along with development of recordable optical recording media to which such blue laser beams can be used.

The present inventors propose the validity of a recording layer containing as a main component a metal or a half metal oxide, in particular bismuth oxide (see Japanese Patent Application Laid-Open (JP-A) Nos. 2003-48375, 2005-161831, and 2005-108396) as a recordable optical recording medium which enables high density recording at a wavelength the same as or less than the wavelength of the blue laser.

The applicant of the present invention discloses in the prior application (Japanese Patent Application Laid-Open (JP-A) No. 2006-247897) a recordable optical recording medium which has a recording layer containing as a main component of the constituent element bismuth and containing bismuth oxide, the recording layer containing one or more elements X selected from B, P, Ga, As, Se, Tc, Pd, Ag, Sb, Te, W, Re, Os, Ir, Pt, Au, Hg, Tl, Po, At, and Cd. The applicant also discloses that the recordable optical recording medium using a film including Bi, B, and oxide has excellent characteristics, and that a sputtering method can be also used as a method for forming this layer.

The sputtering method has been widely known as one of the vapor-phase deposition techniques for thin film deposition. The method is also used in an industrial thin film deposition. In the sputtering method, a target material which has the same component as a film to be deposited is prepared. Normally, argon gas ion which is generated by means of glow discharge in the target material is then allowed to collide with this target material with the result that the constituent atoms of the target material are hammered out, and atoms are accumulated on the substrate with the result that a film is formed. Since oxides generally have high melting points in particular, a method such as vapor deposition is not favorable and thus a radio frequency sputtering that involves application of a high frequency is often used.

Sputtering has produced many results in the manufacturing process and is favorable in a point of through-put. However, in the case where a film made of material containing two or more elements is to be deposited, the resultant film often has a different composition than its sputtering target, thus requiring a consideration for determining the composition of the target. Furthermore, the structure and the quality of the film often differ depending on the form in which the compound constituting the target is contained; thus, it is also required to consider this point.

Furthermore, it is also required to further improve the film deposition rate from the viewpoint of the production cost. For increased film deposition rate, it is required to introduce a large power. In this case as well, it is required to improve the target strength so as to avoid destruction of the target.

As a known technology, for example, Japanese Patent Application Laid-Open (JP-A) No. 11-92922 discloses a Bi-based oxide target as a sputtering target for the formation of a dielectric film. However, this document does not describe a target containing B. If the kinds of constituent elements are different, so is the relationship between the composition and constituent compounds of the aforementioned target and the structure and composition of the deposited film. Consequently, it is required to change the composition of the target. The information disclosed in this document does not constitute a reference of the present invention.

Furthermore, the Publication of the Japanese Patent Application Laid-Open (JP-A) No. 2005-264206 discloses a description of a $Bi_2O_3$-based glass-like target containing $B_2O_3$. However, the invention in this document inevitably contains $SiO_2$ and is associated with the glass-like target with the result that the invention in the document is different from the present invention.

SUMMARY

In an aspect of this disclosure, there is provided a recordable optical recording medium for high density recording, including a film which contains Bi, B and oxygen and which has a stable composition and structure. For this purpose, an appropriate sputtering target is required. However, the form and the structure of a compound constituting the target, impurities, etc., affect the composition and the crystallinity of the film to be formed. Accordingly, the compound constituting a target is one which is suitable for the characteristics of the required film. Consequently, another aspect of this disclosure is to provide a sputtering target and a manufacturing method thereof, the sputtering target being suitable for the realization of the recordable optical recording medium which enables high density recording having such favorable recording characteristics as low jitter, a high density recordable optical recording medium using the sputtering target. In another aspect, there is provided a sputtering target which realizes increased film deposition rate for improved productivity, shows high strength upon film deposition, and has high packing density.

In another aspect of this disclosure, there is provided a recordable recording medium containing Bi and B in the recording layer. The ratio of the number of Bi atoms to the number of B atoms, B/Bi, is set to 1.25 or less. However, as a result of extensive studies made particularly for the recording layer containing Bi and B, the range of their relative proportions within which excellent characteristics, particularly archivability, can be obtained has been established. It has been established that adding B to a recordable optical recording medium containing Bi and B in the recording layer improves archivability. Since the appropriate layer structure is different between a disc for conducting recording and reproduction by allowing light to be incident thereon from the side of a substrate as seen in so-called HD DVD and a disc for conducting recording and reproduction by allowing light to be incident thereon from the side of a cover layer as seen in so-called Blu-ray disc, the appropriate composition of the recording layer tends to be different. In consideration of productivity or the like, it is preferable that the composition of the recording layer be in the same range. Therefore, in another aspect, there is provided a recordable optical recording medium which has favorable characteristics in a disc having a different layer structure and which has particularly improved archivability by causing both the atomic ratio of Bi to B and the content of O, which have not been contemplated in the related art, to fall within their optimal ranges.

The aforementioned sputtering target for preparing a recordable optical recording medium comprises Bi and B.

The aforementioned method for manufacturing a sputtering target comprising Bi and Bi for preparing a recordable optical recording medium can include a sintering method.

The aforementioned recordable optical recording medium comprises a film which comprises as main components Bi, B and oxygen, the film being deposited by using a sputtering target comprising Bi and Bi for preparing a recordable optical recording medium.

The aforementioned recordable optical recording medium comprises a substrate, and recording layer formed over the substrate, the recording layer containing at least Bi, B and O as main components, and the ratio of Bi to B in the recording layer being set to $3/7 \leq Bi/B \leq 8$.

DESCRIPTION OF THE PREFERRED EMBODIMENTS

Figure 1:
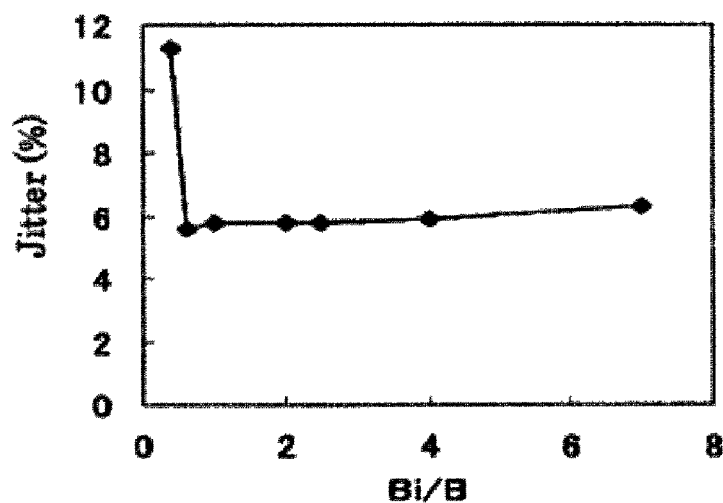
FIG. 1 is a graph of atomic ratio Bi/B vs. jitter value.

Hereinafter, the present invention described above will be explained.

According to a first aspect of the present invention, there is provided a sputtering target containing as main components Bi and B. According to a second aspect of the present invention, there is provided a sputtering target containing as main components Bi, B and oxygen. Bi and B can assume a form wherein they are included as a single element, a form wherein they are included as an oxide, and a form wherein they are included as other compounds. In the case where the sputtering target is used for the deposition of a recording layer of a optical recording medium, the sputtering target is used as an oxide. Consequently, preferably Bi and B are included in the form of single element or oxide. When Bi and B are each included as a single element, it is required that oxygen be added upon film deposition to form an oxide film. When a target including oxygen is used as shown in the second aspect of the present invention, it is not required to add oxygen at the time of film deposition. Note that the main component in first aspect of the present invention and the second aspect of the present invention refer to inclusion of about 90 atom % or more of the aforementioned elements. Normally, except for impurity elements and slight amounts of the component elements in the eighth aspect of the present invention which will be described later, the sputtering target consists only of the aforementioned elements.

According to the third aspect of the present invention 3, there is provided a sputtering target which is crystalline. When the target is amorphous, the target temperature rises in the midst of the film deposition with the result that the target becomes partially or entirely crystalline. Since the strength of the atom bond or the like differs between non-crystals and crystals, a difference is generated in the properties and the composition of the deposited film. When the target is crystalline, the change with the lapse of time can be suppressed. Furthermore, crystal particle diameters or crystal size are made uniform and the crystals are made fine, with the result that the composition shift and disuniformity of the crystal structure can be suppressed.

According to the fourth aspect of the present invention, there is provided a sputtering target in which the atomic ratio of Bi to B is such that $0.6 \leq Bi/B \leq 7.0$. When Bi increases in quantity, it becomes likely that the deposited film undergoes crystallization. Consequently, the recording characteristics and the archivability are deteriorated and cracking of the target is likely to occur, with the result that the productivity becomes worse. On the other hand, when Bi is reduced in quantity, the recording characteristics become worse. Jitters of optical recording media with a recording layer deposited by sputtering of the target having the aforementioned atomic ratio range are favorable (see Example 7 to be described later). In the case where the atomic ratio is smaller than 0.6, it results in an increase in jitter. In the case where the atomic ratio is larger than 7.0, it results in a undesirable archivability reduction.

According to a fifth aspect of the present invention, there is provided a sputtering target including a complex oxide of Bi and B. Assuming a form of the complex oxide enables stable presence of crystals, thereby increasing the target strength. Complex oxides include $Bi_4B_2O_9$, $BiBO_3$, and $Bi_3B_5O_{12}$. Inclusion of the compound comprising three elements of Bi—B—O heightens the target strength, which is favorable.

According to a sixth aspect of the present invention, there is provided a sputtering target including $Bi_4B_2O_9$ as the complex oxide. $Bi_4B_2O_9$ offers excellent film deposition rate and strength among other complex oxides, with the result that an optical recording medium having favorable recording characteristics after film deposition can be realized. Judgment as to whether or not $Bi_4B_2O_9$ is included is made by X-ray diffraction. In the X-ray diffraction analysis, the lattice constant changes due to variations in measurement temperature, the inner stress of the film, variations in the wavelength of the X-ray, or composition shift, and thus shift is generated in an angle at which the refraction peak is generated. With respect to known substances, a response to a question as to at which angle the peak of the X-ray diffraction is generated can be found through the retrieval of the ASTM (American Society for Testing and Material) card and the JCPDS. At the time of identifying the peak of the X-ray diffraction by analyzing the specimen, the ASTM card and "JCPDS card chart" are widely used. Incidentally, the "JCPDS" is an abbreviation for the "Joint Committee on Powder Diffraction Standards". The JCPDS refers to a chart of the X-ray diffraction which is distributed by an organization called the International Centre for Diffraction Data. Currently, the chart of many standard substances is stored for retrieval. The X-ray diffraction chart of specimen whose component is not unknown is compared with a chart of the aforementioned standard substance with the result that it is judged as to which chart of the standard substance is constituent with or is approximate to the chart of the substance whose component is unknown and the specimen is identified in the judgment. An identification method which is conducted by using the "JCPDS card chart" is a method which is widely used in the world as shown in the "general rule of the X-ray diffraction" and an "analysis of the general rule of the X-ray diffraction," (Japanese Industrial Standards) and an "X-ray diffraction analysis" of the ceramic basic standard 3 edited by the Tokyo Institute of Technology. It is investigated as to whether the specimen whose component is unknown is consistent with or is approximate to the chart of the standard substance to identify the substance.

In the identification of the substance, a surface interval is determined by using the Bragg's Law from each measured peak to identify the corresponding crystal structure. Furthermore, in a material in which a specific crystal surface is oriented, it is possible to identify the substance from the peak ratio of a plurality of peaks corresponding to the crystal surface. In the X-ray diffraction, the lattice constant changes because of causes such as the measured temperature, the inner stress of the film, an error of the wavelength of the X-ray, and a composition shift or the like with the result that a shift is generated in the angle in which the diffraction peak is generated. Consequently, when the peak is present in the vicinity of the angle which is generated at the diffraction peak, it is possible to say that the substance is the corresponding substance.

With respect to a shift is generated in the diffraction peak, for example, a peak from the peak having a surface interval of 3.101 Å is referenced from the standard chart of $Bi_4B_2O_9$ (reference code: 25-1089) and the measured result is compared with respect to the other target which is prepared in the same preparation method. Thus, the surface interval of reference data is 3.1010 Å while there is a slight shift in the measurement result such as 3.1058, 3.0952 and the like. However, such degree of shift is generated within the scope of error when the measurement is repeated with the result that it is possible to say that any one includes $Bi_4B_2O_9$.

According to a seventh aspect of the present invention, there is provided a sputtering target whose packing density is 72% to 100%. Increasing the packing density leads to an improvement in the target's strength thereby increasing the film deposition rate. When the packing density is lowered, the film deposition rate slows down. In addition, the target itself becomes fragile with the result that many problems such as the generation of cracking in the formed film or the like occur. Incidentally, the packing density described herein refers to a value obtained by determining in calculation a weight when the target volume is occupied by 100% material substance, and determining the weight as a density in comparison with the weight of the target which is actually prepared. As shown in Example 8 which will be described later, a favorable sputtering target has a packing density of 72% or more. Furthermore, the film deposition rate becomes 1.5 times as fast as the case of 72% when the packing density is 93% or more. Since the packing density becomes still larger in the case of approximately 100%, the advantage is large.

According to an eighth aspect of the present invention, there is provided a sputtering target including at least one element selected from Li, Al, Fe, Mg, NA, and Si. By adding these elements, it becomes easy to increase the packing density. Furthermore, since the connection between crystals can be made strong, it becomes possible to realize a target of high strength. It is preferable that the addition amount be as small as possible. At most, the amount may be about 10 atomic %. When the addition amount is too large, it results in a lost of property as a sputtering target containing as main components Bi and B, or Bi, B and oxygen is lost, which is not favorable.

According to a ninth aspect of the present invention, there is provided a sputtering target in which oxygen is smaller in quantity than the stoichiometric composition. It is possible to improve recording characteristics of the optical recording medium by decreasing the oxygen amount than in the stoichiometric composition. Even when oxygen is small in quantity, it becomes possible to add oxygen at the time of film deposition by sputtering using gas including oxygen. Thus, there is no problem. Furthermore, decreasing oxygen increases the bonding force of crystals thereby providing an effect of improving a target density, improving target's strength, and increasing film deposition rate.

According to a tenth aspect of the present invention, there is provided a sputtering target including at least one of Bi oxide and B oxide. When the B oxide, particularly, $B_2O_3$ oxide exists, the sensitivity at the recording time can be improved because $B_2O_3$ has a low melting point. Furthermore, when at least one of the Bi oxide and B oxide is contained, it results in the deposition of a film that contains as main components Bi, B and oxygen, showing favorable recording characteristics.

According to an eleventh aspect of the present invention, there is provided a method for fabricating a sputtering target using a sintering method. Use of the sintering method enables favorable preparation of a sputtering target having an oxide having a high melting point.

According to a twelfth aspect of the present invention, there is provided a method comprising a step of removing moisture from material powders in the sintering method. The step of removing moisture refers to a step of removing moisture from material powders with such a method as vacuum drying prior to weight measurement. It is also possible to use a step of heating each kind of the material powders at a temperature lower than their melting point but at 100° C. or higher. In the case of oxide at this time, the heat treatment in the atmosphere is enabled.

For example, $B_2O_3$ absorbs moisture with ease with the result that the measurement error of the quantity of the materials can be decreased by adding the step of removing the moisture and the reproduction of the composition is heightened.

According to a thirteenth aspect of the present invention, there is provided a manufacturing method of a sputtering target that involves sintering of $Bi_2O_3$ and $B_2O_3$ powders. Since $Bi_2O_3$ and $B_2O_3$ powders can be easily obtained, the manufacturing costs are low. Furthermore, since these powders have relatively low melting points, it is relatively easy to increase the packing density and to readily provide a target with a high strength. Since $B_2O_3$ has water absorption properties, these powders are smashed by means of a drying method or in an organic solvent and classified with the result that powders having a uniform diameter are provided. Subsequently, the powders are mixed together and molded to have a certain shape, followed by sintering. Sintering is performed by placing the molded article at 420° C. in the atmosphere. It is possible to improve the strength of the target by repeating the cycle of the step of again smashing, molding, and heating the sintered article. In the second and subsequent sintering steps, the sintering temperature can be raised up to about 630° C. When $B_2O_3$ is present in the target, it absorbs moisture, resulting in a high moisture absorption rate and the quality of the target is deteriorated in some cases. In order to avoid this, the powders are mixed in the condition where no moisture is absorbed, and the powders are sintered at a temperature equal to or less than the melting point of $B_2O_3$. The obtained powders are smashed and a target is prepared by conducting heating and pressing type sintering with the result that a target having a high uniformity can be obtained and the advantage is large. Furthermore, the particles may be smashed by sintering particles at a temperature equal to or less than the melting point of $B_2O_3$. In particular, it is important to provide a step in which no $B_2O_3$ is left in the resultant target. Furthermore, the fact that time for sintering at a low temperature of 420° C. or less is prolonged and complex compound of Bi and B is sintered followed by raising the temperature to about 630° C. for short time sintering has a large effect.

A sputtering target can be obtained by bonding the target which has been sintered as described above to an oxygen-free copper backing plate by means of metal bonding or resin bonding.

In an overall flow of the manufacturing process of the sputtering target, it is possible to use a step of weighing materials, dry type ball mill mixing, hot pressing, mold processing and bonding. Furthermore, a step of weighing materials, moisture type ball mill mixing, spray drying, hot pressing, mold processing and bonding can be used.

According to a fourteenth aspect of the present invention, the invention relates to an optical recording medium having a film containing as main components Bi, B and oxygen by using a sputtering target described in any of the first to the tenth aspects of the present invention. A required film is formed on a resin substrate such as a polycarbonate substrate to provide an optical recording medium. A groove or a pit may be formed on the resin substrate for control of tracking or the like. An argon gas is introduced into a vacuum and a high frequency power is applied with the result that a film is formed which contains as main components Bi, B and oxygen. In addition, a metal film as a reflection layer, or a protection layer for improving characteristics may be provided.

According to the first to fourteenth aspects of the present invention, a sputtering target, a manufacturing method thereof and a high density recordable optical recording medium using the sputtering target can be provided, the sputtering target being suitable to the realization of a recordable optical recording medium which has such favorable recording characteristics as low jitter and which enables high density recording. Furthermore, the present invention can provide a sputtering target which enables the improvement in the film deposition rate for the improvement of the productivity and which has a high strength at the time of the film deposition and has an increased packing density.

According to a fifteenth aspect of the present invention, the invention relates to a recordable optical recording medium wherein a recording layer containing at least Bi, B and O is provided on a substrate and the atomic ratio of Bi to B in the recording layer is such that $3/7 \leq Bi/B \leq 8$. In the case where the atomic ratio Bi/B is larger than 8, the archivability is reduced. Although the cause thereof is not clear, it is thought that the recording mark is formed of a Bi single metal, and oxides of Bi and B or the like in the case of the optical recording medium of the present invention. When the proportion of Bi becomes too large, it becomes highly likely that the single metal of Bi is produced and thus it occupies a large area of a recording mark. With Bi single metal, deterioration such as oxidation or the like is likely to occur. It is thought that archivability is reduced in the case where the atomic ratio Bi/B is greater than 8. There is provided an advantage in that the presence of a large area of Bi single metal becomes rare by the addition of B and the area of the Bi single metal is divided into small areas. As a consequence, the recording characteristics and archivability are improved. It is thought that the archivability of the recordable optical recording medium is excellent in the case where the atomic ratio Bi/B is smaller than 3/7. However, it is thought that the recording sensitivity is lowered and the recording becomes insufficient because the phase separation such as separation of Bi occurs with more difficulty. Furthermore, with respect to the target for the formation of the recording layer, the melting point is lowered in the composition containing a large amount of Bi, and the target becomes vulnerable to the thermal change, reducing the target's strength. In addition, with respect to the compound target of Bi—B—O added with B or the like, a ternary compound such as $Bi_4B_2O_9$ comprising three elements can be easily prepared with the result that the connection between atoms becomes strong and the target's strength is improved. However, since the boron oxide has a low melting point on the order of 450° C., it becomes difficult to conduct sintering at a high temperature when B increases. Consequently, a low temperature sintering is required. In the low temperature sintering, the connection strength between particles can be hardly raised with the result that the preparation of the target becomes difficult and the strength is lowered. The content of Bi, B and O as a whole is 100%, namely, it is not required to include other element except for impurities. Furthermore, other element(s) may be added in amounts up to 10%.

Upon determination of the atomic ratio Bi/B, the amounts of Bi, B and O are measured under conditions as shown in Tables 1 and 2 by means of the Rutherford Backward Scattering (RBS) and Nuclear Reaction Analysis (NRA). The composition which is determined with this method includes an error such that Bi is ±0.5 atomic %, B is ±2.0 atomic %, and O is ±3.0 atomic %. The atomic ratio Bi/B and the atomic ratio O/B ratio are measured in the same manner.

TABLE 1

| RBS measuring device | high resolution RBS analyzer HR-RBS500 manufactured by Kobe Steel, Ltd. |
|---|---|
| incident ion energy | 450 KeV |
| ionic species | He$^+$ |
| set scattering angle | 122° |
| incident angle | 29 degrees with respect to the normal line of the surface of the specimen |
| specimen current | 30 nA |
| irradiation quantity | 40 μC |

TABLE 2

| NRA measuring device | belltron type IMV tandem accelerator manufactured by NEC Corporation RBS end station RBS-400 manufactured by CE & A Corporation |
|---|---|
| incident ion energy | 2.275 MeV |
| ionic species | He$^+$ |

TABLE 2-continued

| | |
|---|---|
| set scattering angle | 160° |
| incident angle | 0 degrees with respect to the normal line of the surface of the specimen |
| irradiation quantity | 100 µC |

According to a fifteenth aspect, a recordable optical recording medium excellent in recording characteristics and archivability can be provided by providing a recording layer containing at least Bi, B and O on the substrate, and by setting the atomic ratio of Bi to B in the recording layer such that $3/7 \leq Bi/B \leq 8$.

According to a sixteenth aspect of the present invention, the invention relates to an optical recordable recording medium in which the ratio of O to B in the recording layer is set such that $2.2 \leq O/B \leq 13$. It has been made clear that the quantity of oxygen in the recording layer largely affects the recording characteristics. When the quantity of oxygen is small, the recording sensitivity is heightened. However, since the coefficient of the thermal conductivity of the recording layer is heightened, the heat generated by the light application at the recording time is likely to be widened with the result that it becomes difficult to conduct high density recording. Furthermore, when the quantity of oxygen is too large, the recording sensitivity is lowered, and the recording becomes insufficient with the result that favorable characteristics cannot be easily obtained.

An optimal oxygen amount differs in different atomic ratios Bi/B, so an optimal value of O/B changes accordingly. For example, in the case where the atomic ratio Bi/B is 2/1, it is preferable that O/B be larger than 3.8. Furthermore, when O/B exceeds 4.5, sensitivity is lowered. Therefore, it is preferable that O/B be 4.5 or less.

As considered from the atomic ratio Bi/B, sensitivity is improved with increasing Bi amount, so that there is a tendency that archivability is deteriorated. Consequently, the composition containing too much Bi is not favorable. It becomes possible to improve archivability by increasing the quantity of oxygen even when the atomic ratio Bi/B is the same. That is, when the value of atomic ratio O/B is large, there is a tendency that archivability is improved. Furthermore, when the quantity of oxygen is too large, sensitivity is lowered. It is possible to increase sensitivity by increasing the quantity of Bi.

Furthermore, when the Bi/B=Z is given at the atomic ratio, the case is preferable in which a relation of $0.8 \times (Z+1) \times 1.5 < O/B < 1.1 \times (Z+1) \times 1.5$ is established, For example, each of the characteristics of the specimens is shown in Table 3 from disc 1 through disc 5.

Since the state of Bi, B and $Bi_2O_3$ and $B_2O_3$ is stable in an ideal state, the relation of $O=(Bi+B) \times 1.5$ is established. That is, $O/B=((Bi/B)+1) \times 1.5$ is set. However, the composition of the actual film depends on the state of the target, the property of being easily sputtered in respective elements, an electric power at the time of the film formation, and the flow rate of argon. There are many cases in which the target composition and the composition of the formed film are different. It is required to consider the shift of the composition. Table 4 shows the composition of various Bi—B—O target and the composition of the formed Bi—B—O film which is formed at the target.

TABLE 4

| Measured values (atomic %) of the target | | | Measured values (atomic %) of the analysis of the film | | |
|---|---|---|---|---|---|
| Bi | B | O | Bi | B | O |
| 20.6 | 21.1 | 58.3 | 17.5 | 16.4 | 66.1 |
| 24.4 | 15.7 | 59.9 | 24.1 | 13.8 | 62.1 |
| 26.9 | 13.4 | 59.7 | 27.4 | 11.4 | 61.2 |
| 31.0 | 9.7 | 59.3 | 30.7 | 9.0 | 60.3 |
| 38.0 | 4.1 | 57.9 | 36.8 | 4.6 | 58.6 |

As shown above, it is required to consider a shift in composition resulting from a difference in the condition at the time of the film formation. As a result of the investigation of the composition of the atomic ratio of various Bi/B, it has been made clear that the case in which the relation of the aforementioned equation is set is most preferable in consideration of the shift in composition from the ideal state of O/B. This consequence is shown in Table 3. When an ideal value of the atomic ratio of O/B, namely $O/B=((Bi/B)1) \times 1.5$ is determined from the measured value of the atomic ratio of Bi/B from the disc 1 to disc 5, values in the table are provided. When a disuniformity in values are seen by comparing this value with the value of the atomic ratio of O/B which is a measured value, the values exists within the scope between an ideal atomic ratio of $O/B \times 0.8$ and an ideal atomic ratio of $O/B \times 1.1$☐ Consequently, the composition scope in which this relation is set is preferable. From disk 1 to disk 5, the property is favorable. What corresponds to the scope of the aforementioned equation ranges from disk 1 to disk 4. The jitter values on all the disks from disk 1 to disk 5 assume a value within the scope of 4 to 6 with the result that a favorable property is shown. It is shown that when the optimum record power is high, the sensitivity is inferior, when the optimum power is low, the sensitivity is high. With respect to disk 5, the sensitivity is the highest. When numbers are attached thereto in an order from the highest archivability to the lowest, the results shown in Table 3 is given. Further, when the reproduction optical deterioration endurance is observed, the disk 5 is the worst. When all the disks are generally observed, the scope from the disk 1 to the disk 4 is the most favorable. The disks 1 through 5 are prepared in the same manner as those in Examples 13 through 20 which will be described later.

TABLE 3

| | Bi/B | Measured values O/B | Ideal values O/B | 0.8 × 1.5 × (z + 1) | 1.1 × 1.5 × (z + 1) | Jitters | Optimum recording power (mW) | Higher order in the archiavability | Higher order in the reproduction light deterioration endurance |
|---|---|---|---|---|---|---|---|---|---|
| disc 1 | 1.53 | 3.12 | 3.80 | 3.03 | 4.17 | good | 4.7 | 2 | 2 |
| disc 2 | 1.75 | 4.50 | 4.13 | 3.30 | 4.53 | good | 4.5 | 1 | 1 |
| disc 3 | 3.41 | 6.70 | 6.62 | 5.29 | 7.28 | good | 4.2 | 3 | 3 |
| disc 4 | 8.00 | 12.74 | 13.50 | 10.80 | 14.85 | good | 3.8 | 4 | 4 |
| disc 5 | 2.20 | 3.75 | 4.80 | 3.84 | 5.28 | good | 3.5 | 5 | 5 |

According to a sixteenth aspect of the present invention, a recordable optical recording medium excellent in the recording characteristics and archivability can be provided by setting the atomic ratio of O to B in the recording layer to $2.2 \leq O/B \leq 13$.

According to a seventeenth aspect, there is provided a recordable optical recording medium wherein the proportion of O in the total amount of elements constituting the recording layer is set to the scope of 50% to 67% at the atomic ratio. It is preferable that the scope of 50% to 60% in which the quantity of oxygen is on the smaller side. These facts are apparent from the fact shown in Example 26. It is thought that the recording layer is in the state of oxygen deficiency in the scope in which the quantity of oxygen is small, particularly in the scope of less than 60%. In the state of oxygen deficiency, the phase separation is likely to occur with the result that the recording sensitivity is improved. Further, the heat conductivity of the recording layer is lowered when the quantity of oxygen becomes too small because heat tends to expand, with the result that a small recording mark is formed with difficulty which is unfavorable for high density recording. In addition, when oxygen is deficient, Bi is likely to exist in the metal state. Thus, the state becomes unstable as compared with oxide. Consequently, there is a tendency that the archivability becomes worse. In the scope from 50% to 60%, it is thought that there is almost no problem. When the quantity of oxygen increases, the archivability becomes favorable. However, the sensitivity becomes worse with the result that a favorable recording becomes difficult. That is, from the aspect of the sensitivity, the case in which the quantity of oxygen is smaller than 67% is preferable.

According to the seventeenth aspect, a recordable optical recording medium excellent in the recording characteristics and the archivability can be provided by optimizing the occupation ratio of O in all the quantity of elements constituting the recording layer.

According to an eighteenth aspect, there is provided a recordable optical recording medium provided with a protection layer positioned adjacent to the both surfaces of the recording layer. Since the recording layer is an oxide, the incoming and outgoing of oxygen affect the property. In order to suppress the incoming and the outgoing of oxygen, an attempt can be made to improve the archivability by providing a protection layer on both surfaces of the recording layer. As a protection layer, normally a material is preferable which does not causes decomposition, sublimation, voids or the like due to heat from the recording layer during recording. For example, simple oxide type oxides such as $Al_2O_3$, MgO, $ZrO_2$, $SiO_2$, $SnO_2$, ZnO, $Sm_2O_3$ or the like, and a combination of these oxides, nitrides such as silicon nitride, aluminum nitride, nitrides of B and Ti, and the like, carbon-based non-oxides such as SiC, $B_4C$, TiC, WC and the like, borides such as $LaB_6$, $TiB_2$, $ZrB_2$ and the like, sulfides such as ZnS, CdS, $MoS_2$, silicides such as $MoSi_2$, amorphous carbon, graphite, diamond and the like can be used. Further, it is also possible to use organic materials.

For example, from the viewpoint of transparency and productivity with respect to the recording and reproduction light, the fact that $SiO_2$ or ZnS—$SiO_2$ are used as main components is cited as a favorable example. In addition, in order to obtain a sufficient heat insulation effect, it is preferable to use $ZrO_2$ mainly (as a main component). In addition, since the stability is high, silicon nitrides, aluminum nitrides and aluminum oxides are also preferable. Further, an oxide comprising ZnS, $ZrO_2$, $Y_2O_3$, and $SiO_2$ or an oxide comprising $ZrO_2$, $TiO_2$, $SiO_2$, and X (where X is at least one species selected from $Y_2O_3$, CeO, $Al_2O_3$, MgO, $Nb_2O_5$ and rare earth oxides) is preferable. Here, the main component refers to approximately 90% or more approximately in terms of the mol ratio. For example, with respect to ZnS—$SiO_2$, the film can be formed by means of a direct current sputtering by allowing the material to have conductivity by adding carbon and transparent conductive material. In addition, such method of adding ZnO, GeO or the like and mixing oxide and nitride can be used for the adjustment of heat conductivity.

As a preferable layer structure, in the case of the structure of the so-call HD DVD or the like for applying light through a substrate from the side of the substrate, a layer structure can be cited wherein a protection layer (referred to as a first protection layer), a recording layer, a protection layer (referred to as a second protection layer) and reflection layer are formed in this order on the substrate. Further, in the case of Blu-ray disc or the like, a structure which comprises a substrate, a reflection layer, a protection layer (a second protection layer), a recording layer, a protection layer (a first protection layer) and a cover layer in this order is preferable. In addition, in the case where data items are recorded by using near-field light, a relatively hard layer with a high index of refraction such as a silicon nitride, a diamond carbon or the like is provided on the outermost surface on the side on which light is incident. A layer structure which comprises a substrate, a reflection layer, a protection layer (a second protection layer), a recording layer, and a protection layer (a first protection layer) is preferable. Preferably a lubricant layer is provided on the outermost surface.

According to the eighteenth aspect, a recordable optical recording medium excellent in the recording characteristics and archivability can be provided by using a configuration in which a protection layer is adjacent to both surfaces of the recording layer.

According to a nineteenth aspect, there is provided a recordable optical recording medium wherein the protection layer contains as a main component ZnS—$SiO_2$, silicon nitride, or aluminum oxide. Using as the protection layer ZnS—$SiO_2$, a silicon nitride, or an aluminum oxide provides a large effect of preventing, the incoming and the outgoing of oxygen and moisture and a large effect of improving archivability. Further, with respect to ZnS—$SiO_2$, preferably a stress of the film becomes approximately zero when the ratio of ZnS to $SiO_2$ is set to 80 mol %:20 mol %. In particular, the optical recording medium having a layer structure wherein a film is formed only on one surface of the substrate such as a BD-R or the like is not preferable because the substrate is bent when a stress applied on the film is large. In addition, in a mutually deposited type optical recording medium such as HD-R or the like as well the fact that the stress is small means that the peeling off of the film is caused with difficulty and archivability is excellent and such recording medium is preferable.

According to the nineteenth aspect, a recordable optical recording medium can be provided which is excellent in the recording characteristics and archivability, by allowing the protection layer to contain as a main component, ZnS—$SiO_2$, silicon nitride or aluminum oxide.

According to a twentieth aspect, there is provided an optical recordable recording medium wherein at least a first protection layer, a recording layer, a second protection layer, a reflection layer are sequentially provided on the substrate, the first protection layer comprising aluminum oxide, the second protection layer comprising ZnS—$SiO_2$. The first protection layer serves to protect the recording layer from oxygen and moisture which come in and go out through the substrate. The archivability can be improved by sandwiching the recording layer with the first protection layer and the second protection layer. For the coexistence of the recording characteristics and the archivability, providing a protection layer using an aluminum oxide on the substrate side of the recording layer, and providing a protection layer comprising $ZnS$—$SiO_2$ on the opposite side thereof enables providing optically and thermally an optimum condition which provides favorable characteristics.

According to the twentieth aspect, a recordable optical recording medium can be provided which is excellent in recording characteristics and archivability by providing a layer structure in which at least a first protection layer, a recording layer, a second protection layer, and a reflection layer are sequentially deposited on the substrate, the first protection layer comprising an aluminum oxide, the second protection layer comprising $ZnS$—$SiO_2$.

According to a twenty-first aspect, there is provided a recordable optical recording medium wherein at least a reflection layer, a second protection layer, a recording layer, a first protection layer and a cover layer are sequentially deposited, the second protection layer comprising a silicon nitride, the first protection layer comprising $ZnS$—$SiO_2$. As a protection layer on the side of the reflection layer of the recording layer, silicon nitride is provided. As a protection layer on the opposite side, $ZnS$—$SiO_2$ is provided with the result that a recordable optical recording medium can be realized which shows favorable recording characteristics and archivability. Silicon nitride prevents oxygen and moisture and has a relatively large thermal conductivity with the result that heat generated at the time of the recording on the recording layer can be immediately dissipated to the reflection layer. The silicon nitride allows heat to reside and expand in the recording layer thereby serving to prevent the generation of troubles in the formation of small recording marks. Further, $ZnS$—$SiO_2$ prevents incoming in and outgoing of oxygen and moisture while serving to prevent the deformation to the side of the cover layer. When the thermal conductivity is too high, the recording becomes insufficient. Thus, $ZnS$—$SiO_2$ is preferable which has a relatively low thermal conductivity.

As to the material of the substrate, there is no particular limitation thereto as long as the material has thermally and mechanically excellent property and has an excellent light transmitting property in the case where recording and reproduction is conducted from the side of the substrate (through the substrate).

Specific examples include polycarbonate, polymethylmethacrylate, amorphous polyolefin, cellulose acetate, and polyethylene terephthalate. However, polycarbonate and amorphous polyolefin are preferable. The thickness of the substrate differs depending on the usage thereof. There is no particular limitation thereto.

As a material of the reflection layer, a material having a sufficiently high reflectance at a wavelength of the reproduction light can be used. For example, metals such as Au, Al, Ag, Cu, Ti, Cr, Ni, Pt, Ta, Pd and the like can be used as a single metal or an alloy thereof can be used. Among such metals, Au, Al and Ag have high reflectance and are appropriate as a reflective material. Furthermore, the material may contain other elements while containing the aforementioned metals as a main component. Other elements include metals and half metals such as Mg, Se, Hf, V, Nb, Ru, W, Mn, Re, Fe, Co, Rh, Ir, Zn, Cd, Ga, In, Si, Ge, Te, Pb, Po, Sn, Bi and the like. Among such metals and half metals, the material containing as a main component Ag are particularly preferable from the viewpoint of low cost and high reflectance. A low diffraction layer and a high diffraction layer are alternately deposited to each other with materials other than the metal to form a multi-layer film which can be also used as a reflection layer.

For example, a method for forming the reflection layer includes a sputtering method, an ion plating method, a chemical vapor deposition method, and a vacuum vapor deposition method. A preferable thickness of the reflection layer is 20 nm to 300 nm.

In addition, for the improvement of reflectance, the improvement of the recording characteristics, the improvement of the adhesiveness or the like, a known inorganic species or an organic species an upper coating layer, a lower coating layer or an adherent layer can be provided on the substrate or beneath the reflection layer.

A material of an environment endurance protection layer which is formed on the reflection layer and an interference layer is not particularly limited as long as the protection layer serves to protect the reflection layer and the interference layer from an external force. Organic materials include thermoplastic resins, thermosetting resins, electron beam curable resins, and UV curable resins. In addition, inorganic materials include $SiO_2$, $SiN_4$, $MgF_2$, and $SnO_2$. The thermoplastic resin and the thermosetting resin can be formed by coating and drying a coating liquid which is dissolved in an appropriate solvent. The UV curable resin can be formed by coating a coating liquid as it is or a coating liquid which is dissolved in a solvent and applying UV light thereto to cure the resin. The UV curable resin includes acrylic resins such as urethane acrylate, epoxyacrylate, polyester acrylate or the like. These materials may be used singly or in combination. Instead of a single layer, a multi-layer may be formed. As a method for forming the protection layer, a coating method such as a spin coat method, a cast method or the like, a sputtering method, and a chemical vapor deposition method can be used as with the recording layer. Among such methods, the spin coat method is preferable. The thickness thereof is generally within the range of 0.1 μm to 100 μm. In the present invention, the range of 3 μm to 30 μm is preferable.

In addition, a substrate may be further bonded to the surface of the reflection layer or the interference layer. In addition, the reflection layer and the interference layer surface are allowed to be located opposite to each other with the surfaces thereof being set as inner surfaces with the result that two optical recording media may be deposited to each other. On the mirror finished surface of the substrate, a UV curable resin layer, an inorganic layer may be formed for the surface protection and the prevention of the sticking of dusts or the like.

The cover layer becomes necessary in the case where a lens with a high NA is used in an attempt of increasing recording density. For example, when the NA is heightened, it is required to reduce the thickness of a portion which allows the penetration of the reproduction light. This is because along with the heightening of the NA an allowed quantity of an aberration decreases which is generated with an angle (which is proportional to a square of a product of a so-called tilt angle, a reverse number of a wavelength of the light source, a numeric aperture of an object lens) at which the disc surface is shifted from a vertical direction with respect to a light axis of an optical pickup. This is also because the tilt angle tends to be affected by an aberration resulting from a thickness of the substrate. Consequently, the thickness of the substrate is reduced so that the influence of the aberration with respect to the tilt angle is reduced as much as possible.

Therefore, there is proposed an optical recording medium wherein dents and projections are formed, for example, on the substrate to form a recording layer, a reflection layer is provided on the recording layer followed by providing a light penetration cover layer which allows the penetration of light on the reflection layer with the result that information on the recording layer is reproduced by applying reproduction light from the side of the cover layer; and there is provided an optical recording medium, a recording layer is formed thereon, and an optically transparent cover layer is provided therein, wherein the information in the recording layer is reproduced by applying reproduction light from the side of the cover layer.

By means of such procedure, it is possible to achieve an increased NA of the object lens by thinning the cover layer. That is, it is possible to achieve a further increase in the recording density by providing a thin cover layer and by conducting recording and reproduction from the side of the cover layer.

Incidentally, such a cover layer is generally formed of polycarbonate sheet and UV curable resin. Furthermore, the cover layer according to the present invention may include a layer for bonding the cover layer.

According to the twenty-first aspect, a recordable optical recording medium can be provided which is excellent in the recording characteristics and archivability by providing a layer structure in which at least a reflection layer, a second protection layer, a recording layer, a first protection layer, and a cover layer are sequentially provided on the substrate, the second protection layer comprising silicon nitride, the first protection layer comprising $ZnS$—$SiO_2$.

According to a twenty-second aspect, there is provided a recordable optical recording medium wherein the reflection layer comprises Al alloy. In particular, when the layer structure is formed in such a manner that the reflection layer and $ZnS$—$SiO_2$ layer are located adjacent to each other, Al alloy is preferable for preventing the deterioration of the reflection layer. The reflection layer preferably comprises Ag or an Ag alloy in many cases. Although the Al alloy is inferior to Ag, the Al alloy has a high thermal conductivity and a high reflectance which means that the Al alloy shows a favorable property. Since Ag has a high thermal conductivity, there is a tendency that the sensitivity becomes worse. Further, there is also a tendency that the reflectance also becomes too high, Al alloy is preferable. For example, in the case where the reflection layer is Ag—In alloy in an optical recording medium which has a layer structure comprising a cover layer/a $ZnS$—$SiO_2$ (10 nm)/a Bi—B—O (16 nm)/SiN (12 nm)/a reflection layer (35 nm)/a polycarbonate substrate, the jitter value is 5.8%. However, in the case where AlTi alloy is used, the jitter value is 5.2%. Since the Al alloy has a higher sensitivity and the recording characteristics is favorable, the Al alloy is more preferable.

According to the twenty-second aspect, a recordable optical recording medium excellent in the recording characteristics and archivability can be provided by limiting the material of the reflection layer.

According to a twenty-third aspect of the present invention, the invention relates to a recordable optical recording medium wherein at least a first protection layer, a recording layer, a second protection layer, and a reflection layer are sequentially deposited on the substrate, the thickness of the first protection layer being set to 10 nm to 80 nm, the thickness of the recording layer being set to 6 nm to 30 nm, the thickness of the second protection layer being set to 8 nm to 35 nm, the thickness of the reflection layer being set to 20 nm to 100 nm. When the thickness of the first protection layer is not 10 nm or more, moisture or oxygen comes in and goes out from the recording layer through the substrate with the result that archivability is deteriorated. Furthermore, the sensitivity is improved with an increase in the thickness thereof. However, when the thickness exceeds 80 nm, the heat radiation becomes worse; the recording mark is widened with the result that the recording characteristics is deteriorated. With respect to the recording layer, when the thickness becomes thinner than 6 nm, the sensitivity is deteriorated, and the recording characteristics such as PRSNR or the like is also deteriorated. When the thickness exceeds 30 nm, the reflection is lowered. Although the sensitivity is improved, the recording characteristics is deteriorated. When the second protection becomes thinner than 8 nm, the reflection layer is located at a nearer place with the result that the heat radiation is increased too much and the sensitivity is deteriorated. In an area thicker than 35 nm, the heat radiation becomes worse and the recording mark is widened. When the reflection layer becomes thinner than 20 nm, the reflectance is lowered and the tracking or the like becomes precarious. When the thickness becomes thicker than 100 nm, the sensitivity becomes worse and the recording characteristics is deteriorated.

According to a twenty-fourth aspect of the present invention, the invention related to a recordable optical recording medium wherein at least a reflection layer, a second protection layer, a recording layer, a first protection layer, and a cover layer are sequentially deposited on the substrate, the thickness of the first protection layer being set to 7 nm to 30 nm, the thickness of the recording layer being set to 6 nm to 30 nm, the thickness of the second protection layer being set to 5 nm to 30 nm, the thickness of the reflection layer being set to 30 nm to 80 nm. It has been found that the storage property is deteriorated in the case where the first protection layer is thinner than 7 nm. When the first protection layer is thicker than 30 nm, the heat radiation, and the recording characteristics becomes worse becomes worse because marks tend to expand. When the first protection layer is thinner than 6 nm, the sensitivity becomes worse, and the recording characteristics such as PRSNR or the like also becomes worse. When the thickness of the recording layer becomes thicker than 30 nm, the reflectance is also lowered. Although the sensitivity of the recording layer is improved, the recording characteristics is deteriorated. When the second protection layer becomes thinner than 5 nm, the reflection layer is located at a nearer place with the result that the heat radiation is too good and the sensitivity is deteriorated. When the second protection layer becomes thicker than 30 nm, the heat radiation becomes worse, and the recording mark is widened. When the reflection layer becomes thinner than 30 nm, the heat radiation effect becomes insufficient with the result that the jitter values rise and the recording characteristics is deteriorated. When the reflection layer becomes thicker than 80 nm, the reflectance becomes worse and the recording characteristics is deteriorated.

According to the twenty-third and the twenty fourth aspects, a recordable optical recording medium can be provided which is excellent in the recording characteristics and the archivability by optimizing the thickness of each layer.

According to a twenty-fifth aspect of the present invention, the invention relates to a recordable optical recording medium wherein a recording layer containing Bi, B and O comprises an oxide which is in the state of oxygen deficiency in which oxygen is smaller in quantity than the stoichiometric composition. Stoichiometry refers to a theory showing a quantitative relation of elements in chemical reactions used in the world of chemistry. Here, stoichiometric composition is defined in the following manner. Stoichiometry refers to a composition of elements of compounds which can be formed by stable compounds which each of the constituent elements constitute. For example, here, it is defined that a composition which compounds such as $Bi_2O_3$, $B_2O_3$, $Bi_4B_2O_9$ which exist in a stable state at a normal temperature and at a normal pressure will be referred to as a stoichiometric composition. The oxygen deficiency state in which oxygen is small in quantity than the stoichiometric composition refers to a case in which x<1.5 when a compound of BiOx, namely, $BiO_{1.48}$ or the like. In the case where there is no state of oxygen deficiency, $BiO_{1.5}$ is provided. In the same manner, $BiO_{1.45}$, $Bi_4B_2O_{8.9}$ shows a state of oxygen deficiency. In other words, it can be judged there is no state of oxygen deficiency when Bi exists in the trivalent state. It can be said that there is a state of oxygen deficiency when the monovalent state or the bivalent state is included. The same thing holds true for other elements. A state of a mixture thereof, or a state of a single element which is not an oxide, and a state mixed with the oxide are also included in the present invention. When the oxide in the state of oxygen deficiency exists, the oxide either captures oxygen from the outside, or separates in phase with the result that the oxide will change to a stable state. When $BiO_{1.45}$ exists, the phase separation into two phases; $Bi_2O_3$ and Bi is stable. In the state in which the recording layer is sandwiched between the protective layers to be shielded from the outside, a recording light is applied and a temperature rises so that the recording layer in the state of oxygen deficiency is separated in phase, Bi metal is deposited and condensed to form a recording mark. In the state with no state of oxygen deficiency, or the state of an excessive quantity of oxygen, the phase separation occurs with difficulty, and the sensitivity becomes worse with the result that a favorable recording becomes difficult. In this manner, including oxygen in the state of oxide deficiency in which oxide is smaller in quantity than the stoichiometric composition provides a large effect. As a state in which the recording layer is constituted, any of the following states may be preferably taken; the state of comprising only oxides in the state of oxygen deficiency, the state of a mixture of an oxide in the state of oxygen deficiency and an oxide which is not in the state of oxygen deficiency, or the state of the mixture of oxide in the state of oxygen deficiency and a single element, and the state of a mixture of an oxide in the state of oxygen deficiency, an oxide which is not in the state of oxygen deficiency, and a single element.

According to a twenty-fifth aspect, a recordable optical recording medium excellent in the recording characteristics and the archivability can be provided with the recording layer containing Bi, B and O including an oxide in the state of oxygen deficiency in which oxygen is smaller in quantity than the stoichiometric composition.

According to a twenty-sixth aspect of the present invention, the invention relates to a recordable optical recording medium wherein the recording layer containing Bi, B and O includes Bi oxide which is in the state of oxygen deficiency in which oxygen is smaller in quantity than the stoichiometric composition. Since Bi is likely to be reduced, Bi is likely to be separated in phase with the result that Bi is preferable for the formation of the recording mark. It is preferable that the proportion of Bi oxide which is in the state of oxygen deficiency be 50% to 80% in the total amount of existing Bi. When the proportion is approximately 100%, an effect is provided. A judgment on the state of oxygen deficiency can be made by measuring a vicinity of the energy area of Bi4f in the measurement by means of the X-ray photoelectron spectral analysis (XPS). For example, an element in the trivalent state of Bi is considered to be $Bi_2O_3$. It can be said that the state is free from the oxygen deficiency. In the case where Bi is bivalent, it can be considered that there is a state of oxygen deficiency according to the present invention in the state, the metal state of Bi can be measured. Since the present invention has the same effect when only two kinds of the state of single element of Bi and the Bi oxide exist which is not in the state of oxygen deficiency in which oxygen is smaller in quantity than the stoichiometric composition such as $Bi_2O_3$ or the like, such states can be included in the present invention.

According to the twenty-sixth aspect, a recordable optical recording medium excellent in the recording characteristics and the archivability can be provided with the recording layer containing Bi, B and O includes Bi oxide in the state of oxygen deficiency in which oxygen is smaller in quantity than the stoichiometric composition.

According to a twenty-seventh aspect of the present invention, the invention relates to a recordable optical recording medium wherein a recording mark recorded by light application includes a single element which is not an oxide. Although the details are not clear, the following point can be considered as a formation principle of the recording mark. The recording layer containing elements of Bi, B and O is thought to be in either of the states; the state in which the recording layer exists all in the state of oxides in unrecorded state, or the state in which the single state of respective elements excluding oxygen and the state of oxides are mixed. In the case of this state, the temperature of the recording layer rises when light is applied at the recording time with the result that the stability of the film constituting the recording layer decreases. The state of oxide free from the oxygen deficiency at that time has a high stability so that recording cannot be conducted in a favorable manner. However, when the unrecorded state exists in the state of oxygen deficiency, the state is changed to a stable state by applying recording light. Changing from the state of oxygen deficiency to a state of mixture of oxide free from oxygen deficiency and a single element facilitates the formation of recording marks. With respect to this recording mark, a difference in the optical property with the unrecorded portion is enlarged by the deposition of the single element thereby enabling enlarging a difference in the reflectance. As a consequence, the amplitude of a reproduction signal is enlarged and a more favorable property can be shown. Furthermore, in the case where the single element and the oxide exist in the unrecorded state, a rise in the temperature of the recording layer by the application of the recording light allows the oxide to separate oxygen with the result that a form of a single element can be provided. At a portion where the recording light is applied, the oxide decreases and the single element increases. Alternately, the oxide and the single element are respectively condensed with the result that a phase separation-like state is realized. In the state in which fine single elements are mixed in the oxide, recording light is applied with the result that there is provided a state in which the single element is grown and the single element is condensed in the oxide and is distributed. This provides a recording mark. With respect to the recording mark, a difference in the optical property with the unrecorded portion is enlarged by the deposition of the single element thereby enabling enlarging a difference in the reflectance. As a consequence, the amplitude of a reproduction signal is enlarged and a more favorable property can be shown. In particular, it is preferable that the Bi oxide easily separates oxygen. It is preferable that in the unrecorded state, the Bi oxide exists in the state of oxygen deficiency, and application of the recording light serve to separate in phase the single element of Bi and exists in the recording mark with the result that the recording mark is formed. In addition, it is also preferable in the non-recorded state that fine Bi exist as a single entity mixed with an oxide thereof, and recording marks are formed in such a manner that Bi is grown and is deposited. It is also preferable that the other oxides be deposited, and recording marks are formed in the mixed state.

According to the twenty-seventh aspect, a recordable optical recording medium excellent in the recording characteristics and the archivability can be provided wherein the recording mark recorded by light application includes a single element which is not an oxide.

According to a twenty-eighth aspect of the present invention, the invention relates to a recordable optical recording medium wherein the recording mark recorded by light application does not show any distinct crystal structures. Optical recording is made by means of the change in the optical property such as deformation, a change in a crystal structure or the like in many cases. However, the present invention is characterized by the fact that the recording mark does not show any distinct crystal structures, but is amorphous as determined by X-ray diffraction in the same manner as the unrecorded state. When the crystal structure of the recording mark is measured by X-ray diffraction, a crystal peak is not measured and is amorphous. Although we can only speculate the cause of the crystal structure in the recording mark, the absence of distinct crystal structures may enable suppressing of the deformation of the portion of the recording mark to provide favorable characteristics.

According to the twenty-eighth aspect, a recordable optical recording medium excellent in the recording characteristics and the archivability can be provided wherein the recording marks recorded by light application show no distinct crystal structures.

As has been described above, according to the fifteenth to the twenty-eighth aspects of the present invention, there can be provided a recordable optical recording medium having excellent recording characteristics and archivability, in particular, an excellent recordable optical recording medium which conforms to the HD DVD-R standard, or the BD-R standard.

EXAMPLES

Hereinafter, the present invention will be further specifically explained with reference to Examples and Comparative Examples. However, the present invention is not limited by these Examples Examples 1 and 2

Powders of $Bi_2O_3$ and $B_2O_3$ were weighed in the state free from moisture adsorption in such a manner that the atomic ratio of B to Bi was set to 2:1. After dry mixture with the ball mill for one hour, the powders were sintered for one hour at 420° C. (Example 1). Furthermore, in a separate manner, while conducting a dry mixture for one hour with the ball mill, the powders were sintered for one hour at 420° C. (Example 2). Next, a sputtering target was prepared by press molding the powders at 100 MPa through 200 MPa and sintering the powders for 5 hours at 600° C. in the atmosphere.

The target is formed into a disc-like configuration having a diameter of 200 mm and a thickness of 6 mm. These targets were bonded to oxygen-free copper-made backing plate by means of metal bonding to obtain sputtering targets 1 and 2. The packing density of these targets was 98% and 96%, respectively.

Examples 3 and 4

Recordable optical recording media according to Examples 3 and 4 were prepared by using the sputtering targets 1 and 2 prepared in Examples 1 and 2.

On a polycarbonate substrate (product name: ST3000 manufactured by Teijin Bayer Polytec Co. Ltd.) having a guide groove (with a groove depth of 21 nm, a groove width of 0.16 μm, and a track pitch of 0.32 μm), by the sputtering method an AlTi alloy (Ti: 10 weight %) film having a thickness of 35 nm, a $ZnS-SiO_2$ (80:20 mol %) film having a thickness of 20 nm, and a film (Bi—B—O film) having a thickness of 15 nm and comprising Bi, B and oxygen were sequentially provided, followed by further laminating thereon a polycarbonate sheet (manufactured by Teijin Kasei; Pure Ace) to a thickness of 75 μm by using a UV curable resin (manufactured by Nippon Kayaku DVD003) to provide a light transmitting layer with the result that a recordable optical recording medium (an recordable optical recording medium that meets the requirement of the so-called Blu-ray standard) according to the present invention was prepared to a thickness of about 1.2 mm.

With respect to these recordable optical recording media, recording and reproduction are conducted from the side of the light transmitting layer by using an optical disc evaluation device DDU-1000 (wavelength: 405 nm, NA: 0.85) manufactured by Pulstec Industrial Co., Ltd. to measure jitters at that time. Example 3 showed a jitter of 5.8%, and Example 4 showed a jitter of 5.9%. These values were favorable. The recording conditions were given as follows. The reproduction power was set to 0.2 mW.

Modulation method: 1-7 modulation
Recording linear density: shortest mark length 2T=0.149 (μm)
Recording linear velocity: 4.9 (m/s)
Waveform equalization: limit equalizer
Recording power: 6.1 mW Example 5

Powders of Bi and B were mixed by wet method for one hour with a ball mill in such a manner that the atomic ratio thereof became 2 to 1 followed by sintering the powders for eight hours at 250° C. in the atmosphere while pressing and molding the powders at 100 to 200 MP with the result that a sputtering target was prepared by means of hot pressing.

The target was formed into a disc-like configuration having a diameter of 200 mm and a thickness of 6 mm. This target was bonded to a packing plate made of oxygen-free copper by means of metal bonding to obtain a sputtering target 3. The packing density of this target was 96%.

Example 6

Except for the fact that the Bi—B—O film was prepared in the midst of mixed gas of argon and oxygen (Ar:oxygen=40:6; by volume) by using a sputtering target 3 which was prepared in Example 5, a recordable optical recording medium was prepared in the same manner as Example 3 and jitters were measured to show 4.8%, which was favorable.

Example 7

Except for the fact that the atomic ratio of Bi:B in $Bi_2O_3$, and $B_2O_3$ were changed, the sputtering targets 4 through 10 were prepared in the same manner as that in Example 1. Except for the fact that the recording layer was formed into a film by using these targets, the recordable optical recording medium was prepared in the same manner as that in Example 3. The result of jitter measurement by conducting recording reproduction is shown in FIG. 1. Incidentally, the atomic ratio of Bi/B at each point and jitters (%) in FIG. 1 are shown in Table 5.

TABLE 5

| Bi/B | Jitter (%) |
|---|---|
| 0.4 | 11.3 |
| 0.6 | 5.6 |
| 1 | 5.8 |
| 2 | 5.8 |
| 2.5 | 5.8 |
| 4 | 5.9 |
| 7 | 6.3 |

From FIG. 1, it can be seen that favorable jitters can be obtained within the range of 0.6≦Bi/B≦7.0.

Example 8

Except for the fact that the sintering conditions were changed, the sputtering target was prepared in the same manner as that in Example 1, the packing density, the validity of the preparation, and the film deposition rate for the sputtering target (the film was formed with the sputtering device (DVD Sprinter) manufactured by the Unaxis Co. Ltd.) are shown in Table 6. The DVD Sprinter is used for manufacture of optical recording media.

As can be seen from Table 6, in the case where the packing density is 50% or less, the material is fragile, and the target could not be prepared. Furthermore, in the case where packing density was 64%, the target was successfully prepared, but the film deposition rate was insufficient. When power applied at the time of film deposition was increased, the film deposition rate was improved. However, the target was damaged with the result that a sufficient film deposition rate was not obtained. In contrast, it succeeded in obtaining a sufficient film deposition rate in the case where packing density was 72%.

TABLE 6

| packing density (%) | validity of the preparation of the target | speed of the film formation |
|---|---|---|
| ≦50 | X | — |
| 64 | ○ | X |
| 72 | ○ | ○ |
| 93 | ○ | ○ |
| 96 | ○ | ○ |
| 100 | ○ | ○ |

Example 9

Powders of $Bi_2O_3$ and B were weighed in such a manner that the atomic ratio of Bi and B were set to 3:1 and the powders are wetted and mixed with a ball mill for one hour followed by sintering the powders for eight hours at 420° C. in the atmosphere while pressing and molding the powders at 100 MPa to 200 MPa and hot pressing the powders to prepare a sputtering target. The sputtering target is formed in a disc-like configuration in such a manner that the diameter is 200 mm and the thickness is 6 mm. This target is bonded to a packing plate made of oxygen-free copper with metal bonding to obtain a sputtering target 11. The packing density of this target was 98%. The present Example corresponds to a case in which oxygen is smaller in quantity than the stoichiometric composition.

Example 10

Except for the fact that a sputtering target 11 prepared in Example 9 was used to prepare a Bi—B—O film in the midst of mixed gas of argon and oxygen (Ar:oxygen: 20:1; by volume), a recordable optical recording medium was prepared in the same manner as that of Example 3 and jitters are measured to show 5.1% which means that favorable characteristics can be obtained.

Example 11

Except for the fact that a step of subjecting the powders of $Bi_2O_3$ and $B_2O_3$ to vacuum drying for 24 hours at 150° C. to remove moisture was added as a step before the weight measurement, the sputtering target 12 was prepared in the same step as that in Example 1. The vacuum degree at the time of vacuum drying was about 10 Pa to 1000 Pa at which the vacuum drawing is conducted with a normal rotary pump. The packing density of this target was 99%.

The recordable optical recording medium was prepared in the same manner as that in Example 3 by using the aforementioned sputtering target 12 to conduct recording and reproduction with the result that jitters was measured to be 5.3%.

Example 12

An X-ray diffraction pattern of the sputtering target 12 prepared in Example 11 was measured. The measurement condition is shown in Table 7. The measurement result is shown in FIG. 2.

Retrieval was made for identifying the position of the diffraction peak obtained in this measurement to refer to known substance. The upper stage of FIG. 2 shows a diffraction pattern of the sputtering target 12 while the lower stage thereof shows with known data items a position where the diffraction peak of $Bi_4B_2O_9$. For the X-ray diffraction a database is constructed which tells where the diffraction line of the known substance appears and the intensity of that diffraction line. Comparing the peaks of an analyte with those of the known substance makes it possible to identify the analyte. As a result of retrieval by means of comparison with the $Bi_4B_2O_9$ data items shown in the lower stage and the measured data items shown in the upper stage, it was confirmed that almost all the peaks were the peaks for $Bi_4B_2O_9$ and that this sputtering target primarily comprises $Bi_4B_2O_9$ compound.

Figure 2:
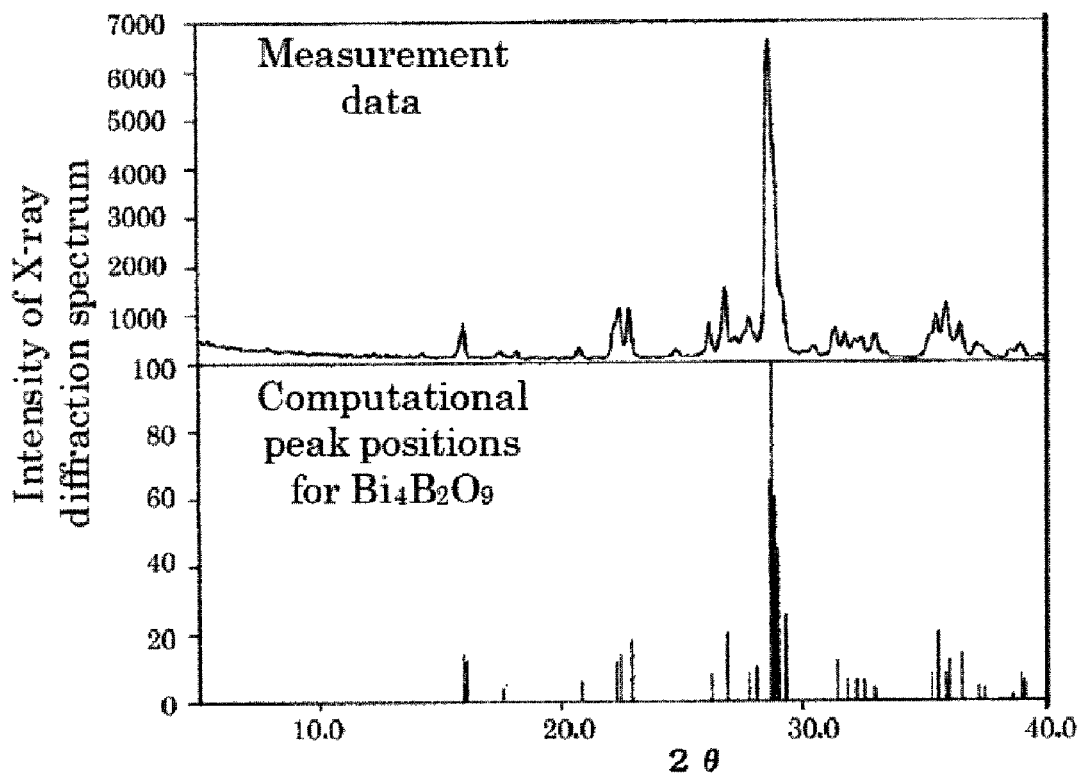
FIG. 2 shows the measurement result of X-ray refraction spectrum of the sputtering target 12.

That is, as a result of the X-ray diffraction shown in FIG. 2, a distinct peak was detected and the peak was consistent with the peak position calculated at the time when it was supposed that a crystalline substance of $Bi_4B_2O_9$ existed, it can be said that a crystal of $Bi_4B_2O_9$ exists. Thus, it can be exemplified that the substance is preferable in the case where the target is crystalline.

TABLE 7

| laser source | Cu |
|---|---|
| wavelength | 1.54056 Å |
| monochrome meter | use |
| tube current | 100 mA |
| tube voltage | 40 kV |
| data range | 5-40 deg |
| scan axis | 2θ/θ |
| sampling interval | 0.020 deg |
| scanning speed | 8.00 deg/min |
| diverging slit | 1.00 deg |
| scattering slit | 1.00 deg |
| light receiving slit | 0.15 mm |

Comparative Example 1

$Bi_2O_3$ and $MoO_3$ are mixed at 70:30 (mol ratio) and sintered, and a sputtering target having a diameter of 76.2 mm and thickness of 4 mm was prepared, followed by deposition of a film. BiMoO contains as main components Bi and Mo and oxygen. An applied power and an intensity of the target at that time were measured, and a result thereof is shown in Table 8. A case in which the film was normally formed is shown by symbol O. On the other hand, a case in which the target was damaged is shown by symbol x.

For a comparison purpose, data for an article obtained by mixing $Bi_2O_3$ and $B_2O_3$ powders in proportions of 2:1 followed by sintering are shown.

TABLE 8

| Applied voltage (W) | BiMoO | BiBO |
|---|---|---|
| 50 | X | O |
| 100 | X | O |
| 200 | X | O |

Example 13 Through Example 22

On a polycarbonate substrate (product name: ST3000 manufactured by Teijin Bayer Polytec Co. Ltd.) having a thickness of 1.1 mm and a diameter of 120 mm and having a guide groove (with a groove depth of 21 nm and a track pitch of 0.32 μm) by sputtering, an AlTi alloy (Ti: 1.0 weight %) layer having a thickness of 35 nm, a ZnS—$SiO_2$ (80:20 mol %) layer having a thickness of 10 nm, a layer comprising Bi, B and O (a Bi—B—O layer) having a thickness of 16 nm, a ZnS—$SiO_2$ (80:20 mol %) layer having a thickness of 10 nm are sequentially provided followed by further depositing thereon a polycarbonate sheet (manufactured by Teijin Kasei; Pure Ace) having a thickness of 75 μm by using a UV curable resin (manufactured by Nippon Kayaku DVD003) to form a light transparent layer with the result that a recordable optical recording medium of the present invention (a recordable optical recording medium corresponding to the standard of a so-called Blu-ray disc) was prepared.

With respect to the recordable optical recording in a condition corresponding to the recordable Blu-ray disc standard (BD-R version 1.1) medium according to Examples 13 through 22 in Tables 9 and 10, recording is conducted by using an optical disc evaluation device ODU-1000 (wavelength: 405 nm, NA: 0.85) manufactured by Pulse Tec Industries Co. Ltd. to evaluate jitter values.

TABLE 9

| Examples | The atomic ratio Bi/B | The atomic ratio O/B |
|---|---|---|
| Example 13 | 1 | 2.4 |
| Example 14 | 1.74 | 3.1 |
| Example 15 | 2.61 | 4.5 |
| Example 16 | 3.41 | 6.7 |
| Example 17 | 8.0 | 12.7 |
| Example 18 | 0.58 | 2.4 |
| Example 19 | 0.7 | 2.5 |
| Example 20 | 0.93 | 2.7 |

TABLE 10

| Examples | The atomic ratio Bi/B | The atomic ratio O/B |
|---|---|---|
| Example 21 | 9.0 | 14.2 |
| Example 22 | 0.4 | 2.1 |

Figure 3:
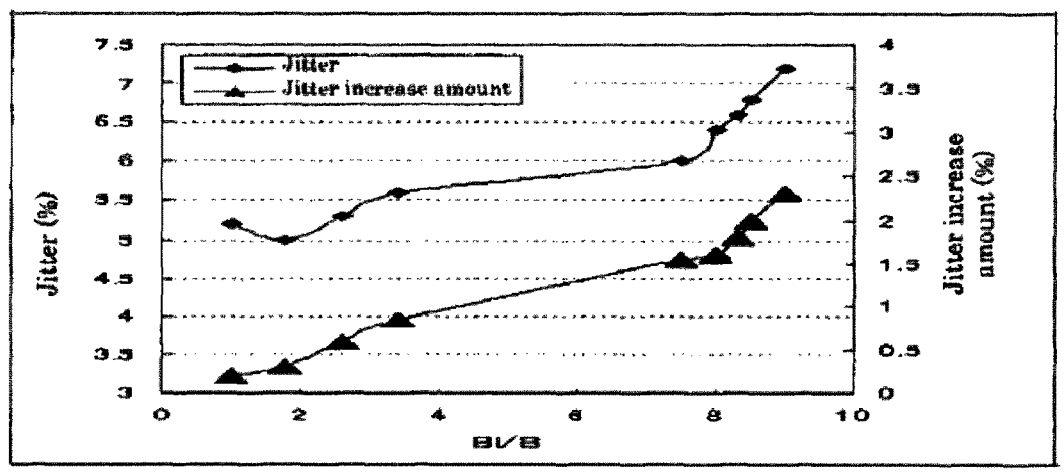
FIG. 3 shows jitter values and increase amounts of jitter values after 100 hours of the storage test.

FIG. 3 shows evaluation results of Examples 13 through 17 and 21. Jitter values after conducting the storage test for 100 hours in the environment at temperature of 80° C. and moisture of 85% and an increase amount of jitter value before and after the storage test are shown. At an atomic ratio of Bi/B=9, jitter values significantly increased. Incidentally, it is regulated that the standard values of jitters of BD-R were 6.5% or less. Up to the atomic ratio of at atomic ratio of Bi/B=8, the increase amount of jitter value was small and favorable characteristics are shown. Up to the atomic ratio of O/B=12.7, favorable characteristics are shown, but the jitter value showed a significant increase at 14.2.

Figure 4:
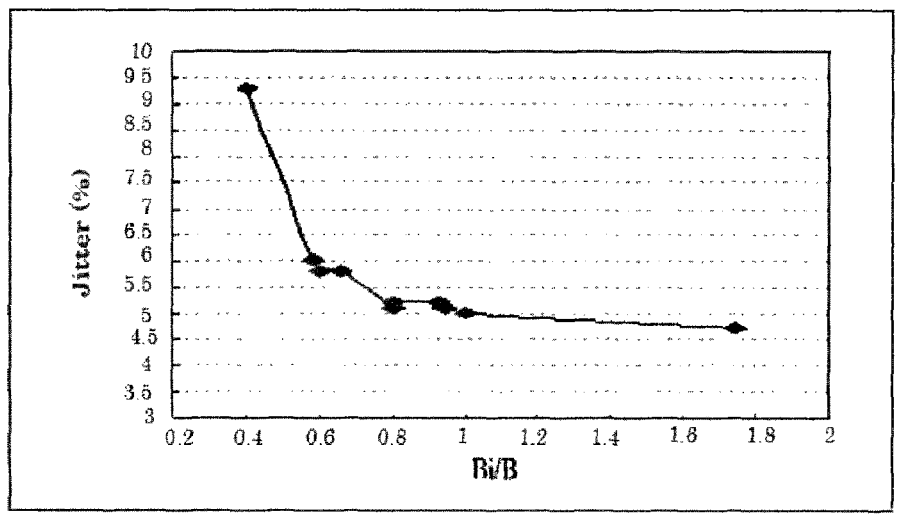
FIG. 4 is a graph of atomic ratio Bi/B vs. jitter value.

FIG. 4 shows the results of Example 18 through Example 20 and 22. At the atomic ratio of Bi/B and the atomic ratio of O/B that shows at Example 22, jitter values significantly increased. In a composition in which the atomic ratio Bi/B was small, the difference in jitter value before and after the storage test became small.

In addition, when the atomic ratio Bi/B is smaller than 0.8, the sensitivity tends to become relatively decrease, with the result that it is preferable that the atomic ratio Bi/B be 0.8 or more.

Example 23

On a polycarbonate substrate having a guide groove (with a groove depth of 26 nm and a track pitch of 0.4 μm), by the sputtering method a ZnS—$SiO_2$ layer with a thickness of 15 nm (ZnS:SiO2=80:20 mol %), a Bi—B—O layer with a thickness of 15 nm which serves as a recording layer, and a ZnS—$SiO_2$ layer with a thickness of 20 nm (ZnS:$SiO_2$=80:20 mol %) are sequentially deposited. As the Bi—B—O layer, a layer having an atomic ratio of Bi/B of 7.9 and the atomic ratio O/B of 13.2 was used. Then, an AlTi alloy (Ti: 1.0 weight %) layer was provided to a thickness of 40 nm by the sputtering method, and an organic protection layer comprising an UV curable resin (manufactured by San Nopco Co., Ltd.: Nopco Cure 134) was provided to a thickness to about 5 μm on the AlTi alloy layer by spin coating followed laminating the layers with a dummy substrate having a thickness of 0.6 mm, and the UV-curable resin to provide a recordable optical recording medium. Recording is conducted in a condition in conformity with the HD DVD-R standard (DVD specifications for high density recordable disc (HD DVD-R) version 1.0) by using an optical disc evaluation device ODU-1000 (wavelength: 405 nm, NA: 0.65) manufactured by Pulstec Industrial Co. Ltd. with respect to this recordable optical recording medium to measure PRSNR with the result that a favorable value of 22.0 (standard value: 15 or more) was obtained. Furthermore, the PRSNR after the storage test for 300 hours at a temperature of 80° C. and a moisture of 85% became 16.0 and a favorable property was shown.

Example 24

On a polycarbonate substrate having a guide groove (a groove depth of 26 nm and track pitch of 0.4 μm), by the sputtering method an aluminum oxide layer ($Al_2O_3$) layer with a thickness of 15 nm, a Bi—B—O layer with a thickness of 15 nm which serves as a recording layer and a ZnS—$SiO_2$ (ZnS:$SiO_2$=80:20 mol %) layer with a thickness of 20 nm were sequentially deposited. As the Bi—B—O layer, a layer having an atomic ratio Bi/B of 1.75 and an atomic ratio O/B of 4.5 was used.

Next, an AlTi alloy (Ti: 1.0 weight %) layer having a thickness of 40 nm was provided by the sputtering method, and an organic protection layer made of UV curable resin (Sun Nopco Co., Ltd.: Nopco Cure 134) and having a thickness of about 5 μm was provided by spin coating. Furthermore, the dummy substrate having a thickness of 0.6 mm was bonded to the protection layer to provide a recordable optical recording medium. Recording was conducted in a condition in conformity with the standard of HD DVD-R (DVD specifications for high density recordable disc (HD DVD-R) version 1.0) by using an optical disc evaluation device ODU-1000 (wavelength: 405 nm, NA: 0.65) manufactured by Pulstec Industrial CO., Ltd. with respect to this recordable optical recording medium to measure PRSNR with the result that a favorable value of 29.0 (standard value: 15 or more) was obtained. Furthermore, the PRSNR after the storage test for 300 hours at a temperature of 80° C. and a moisture of 85% became 23.0 and a favorable property was shown. It was made clear that in the case where the aluminum oxide layer was replaced with the $ZnS$—$SiO_2$ layer ($ZnS:SiO_2=80:20$ mol %), the value of PRSNR was 24.0, and decreased to 19.0 after the storage test, and the value of the PRSNR in the case of using an aluminum oxide layer was further higher.

Example 25

Figure 5:
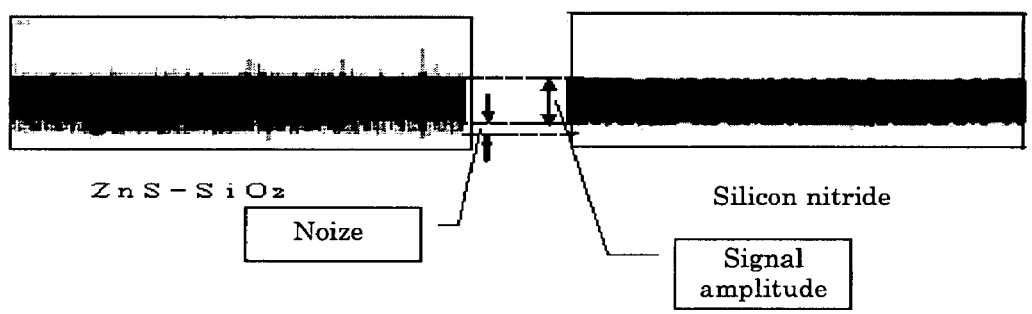
FIG. 5 is a view used for explaining Example 25.

On a polycarbonate substrate (product name: ST3000 manufactured by Teijin Bayer Polytec Co., Ltd) having a guide groove (with a groove depth of 21 nm and a track pitch of 0.32 μm) and having a thickness of 1.1 mm and diameter of 120 mm by the sputtering method a AlTi alloy (Ti: 1.0 weight %) layer serving as a reflection layer and having a thickness of 35 nm, a silicon nitride layer serving as a second protection layer and having a thickness of 10 nm, a layer (Bi—B—O layer) comprising Bi, B and oxygen and having a thickness of 16 nm and a $ZnS$—$SiO_2$ (80:20 mol %) layer of 12 nm thickness were sequentially provided followed by laminating thereon a polycarbonate sheet (manufactured by Teijin Kasei; Pure Ace) having a thickness of 75 μm by using UV-curable resin (manufactured by Nippon Kayaku; DVD003) to provide a light transmitting layer having a thickness of 1.2 mm thereby preparing a recordable optical recording medium of the present invention (a recordable optical recording medium which corresponds to the standard of the so-called Blu-ray disc). As the Bi—B—O layer, a layer having the atomic ratio Bi/B of 1.75 and the atomic ratio O/B of 4.5 was used. Recording was conducted in a condition in conformity with the standard of the recordable Blu-ray disc (BD-R version 1.1) by using the optical disc evaluation device ODU-1000 (wavelength: 405 nm, NA: 0.85) manufactured by Pulstec Industrial Co., Ltd. with respect to this recordable optical recording medium to measure jitter values. The jitter value before the storage test was 5.1%. The jitter after 300 hour-storage test at a temperature of 80° C. and moisture of 85% was 6.1%. It was established that favorable characteristics could be obtained. Furthermore, as shown in FIG. 5, it was made clear that with respect to the reproduction signal after storage, a disc using silicon nitride had a smaller noise and preferably the silicon nitride was used as the second protection layer.

Example 26

Figure 6:
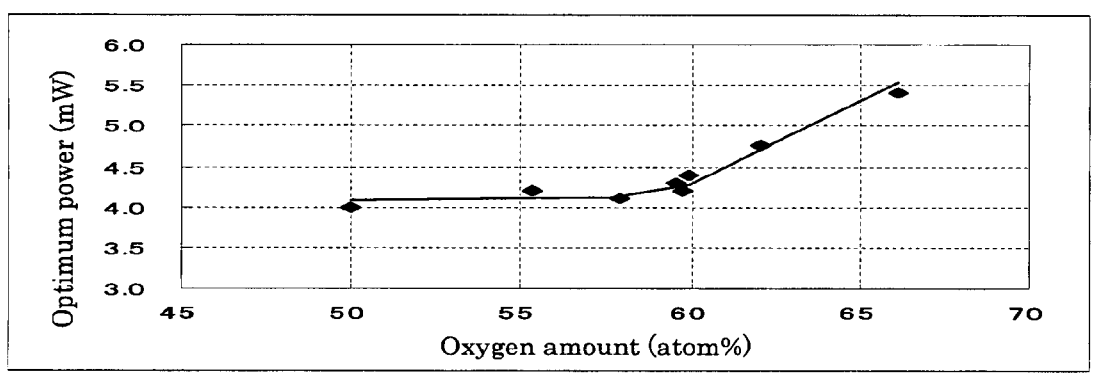
FIG. 6 is a graph of oxygen amount vs. recording power.
Figure 7:
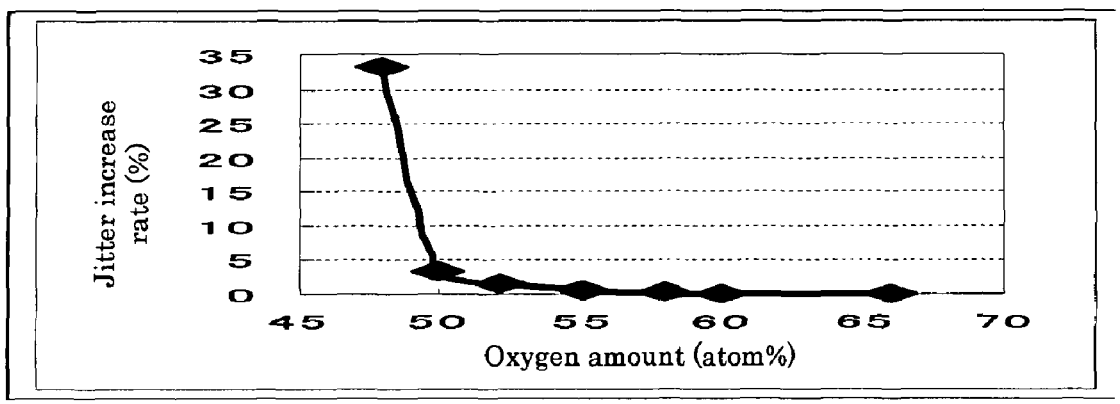
FIG. 7 is a graph of oxygen amount vs. archivability.

Example 26 is an example wherein the content of O in total elements is in a range of 50% to 67% when expressed in atomic ratio. On a polycarbonate substrate (product name: ST3000 manufactured by Teijin Bayer Polytec Co., Ltd.) having as a guide groove (a groove depth of 21 nm, a track pitch of 0.32 μm) and having a thickness of 1.1 mm and a diameter of 120 mm, by means of the sputtering method, an AlTi alloy (Ti: 1.0 weight %) serving as a reflection layer and having a thickness of 35 nm, a $ZnS$—$SiO_2$ (80:20 mol %) layer serving as a second protection layer and having a thickness of 10 nm, a layer (Bi—B—O layer) comprising Bi, B and O and having a thickness of 16 nm, and a $ZnS$—$SiO_2$ (80:20 mol %) layer having a thickness of 10 nm were sequentially provided, followed by laminating thereon a polycarbonate sheet (manufactured by Teijin Kasei; Pure Ace) having a thickness of 75 μm by using a UV curable resin (manufactured by Nippon Kayaku; DVD003) to provide a light penetration layer with the result that a recordable optical recording medium of the present invention (a recordable optical recording medium which corresponds to the standard of a so-called Blu-ray disc) was prepared. With respect to this recordable optical recording medium, recording was conducted in a condition corresponding to the standard of the recordable blue-ray disc (BD-R version 1.1) by using an optical disc evaluation device ODU-1000 (wavelength: 405 nm, NA: 0.85) manufactured by Pulstec Industrial Co., Ltd. to evaluate the recording characteristics. The relationship between the quantity of oxygen in the Bi—B—O layer and the optimum recording power is shown in FIG. 6. When the quantity of oxygen is within this scope, the optimum recording power was restricted to a scope of the standard value and shows a favorable power. In a scope less than 60 atomic % of the quantity of oxygen, a particularly favorable value is shown. Furthermore, a result of the investigation as to what degree the jitter values increased before and after storage test is shown in FIG. 7. A variation quantity of the jitter values before and after the storage test is shown by the ratio of the jitter values before the storage test. Values after 300 hours storage test were used. It can be seen that when the quantity of oxygen is 50% or more, the increase amounts of jitter value were relatively small, which is preferable. It can be seen that when the quantity of oxygen is 55% or more, virtually no change was shown, which is more preferable.

Furthermore, the same recording is conducted on the recordable optical recording medium which is identical to that described above except that an AlTi alloy (Ti: 1.0 weight %) layer serving as a reflection layer and having a thickness of 35 nm, a $ZnS$—$SiO_2$ (80:20 mol %) layer serving as a second protection layer and having a thickness of 25 nm, and a layer (Bi—B—O layer of oxygen 68 atom %) layer comprising Bi, B and oxygen and having a thickness of 16 nm are sequentially formed followed by laminating thereon a polycarbonate sheet (manufactured by Teijin Kasei; Pure Ace) having a thickness of 75 μm by using a UV curable resin (manufactured by Nippon Kayaku; DVD0003) to provide a light transmitting layer. At a recording power of 5.6 mW, a jitter of 5.8% was obtained. However, it was made clear that when the recording linear velocity was doubled (2× recording) the jitter value became 6.5% or less only in the case where the record light was 7.2 mW and the sensitivity decreased and was out of the standard.

Example 27

Figure 8:
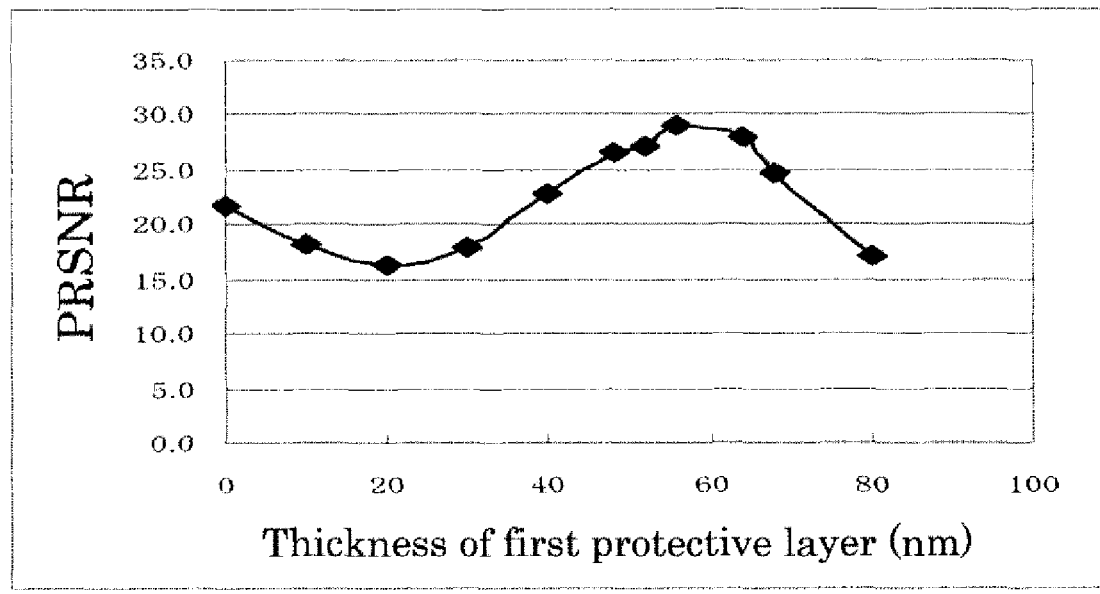
FIG. 8 is a graph of thickness of the first protection layer vs. PRSNR value.
Figure 9:
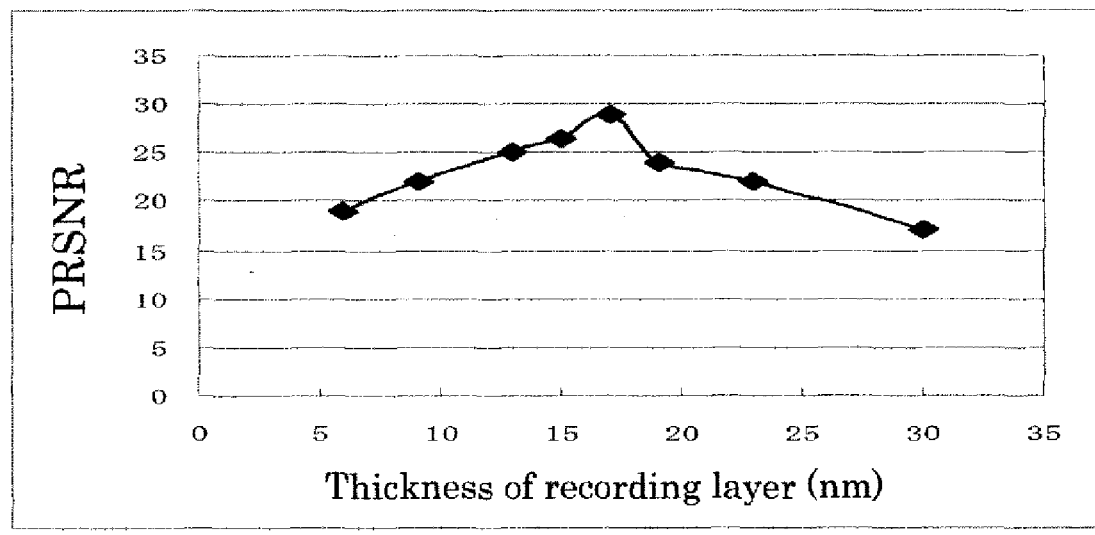
FIG. 9 is a graph of thickness of the recording layer vs. PRSNR value.
Figure 10:
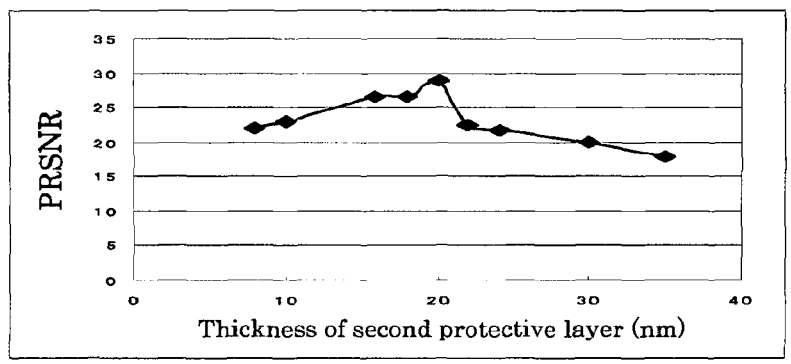
FIG. 10 is a graph of thickness of the second protection layer vs. PRSNR value.
Figure 11:
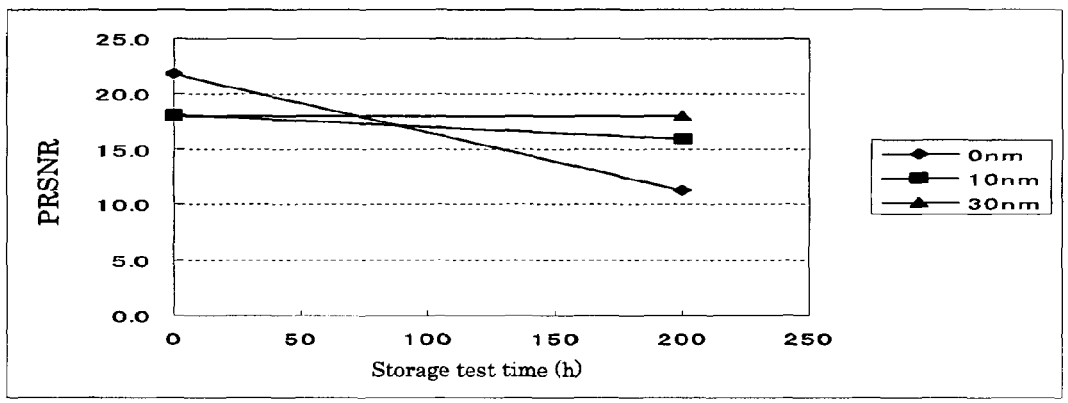
FIG. 11 is a graph of storage test time vs. PRSNR value.
Figure 12:
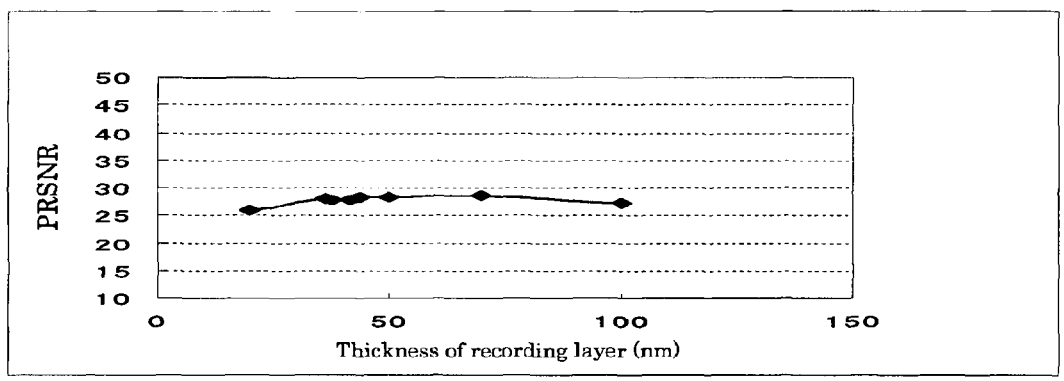
FIG. 12 is a graph of thickness of the reflection layer vs. PRSNR value.

On a polycarbonate substrate having a guide groove (with a groove depth of 26 nm and a track pitch of 0.4 μm), by using the sputtering method, a $ZnS$—$SiO_2$ layer ($ZnS:SiO_2=80:20$ mol %) serving as the first protection layer, a Bi—B—O layer serving as the recording layer, a $ZnS$—$SiO_2$ layer ($ZnS:SiO_2=80:20$ mol %) serving as the second protection layer, and a AlTi alloy (Ti: 1.0 weight %) layer serving as the reflection layer were sequentially deposited. As the Bi—B—O layer, a layer having a composition of Bi 27.0-B13.1-O59.9 was used. Next, an organic protection layer comprising a UV curable resin (manufactured by San Nopco Co., Ltd; Nopco Cure 134) and having a thickness of about 5 μm was provided on the AlTi alloy layer by spin coating, followed by further laminating a dummy substrate having a thickness of 0.6 mm and a UV curable resin to obtain a recordable optical recording medium. Recording was conducted in a condition corresponding to the HD DVD-R standard (DVD specifications for high density recordable disc (HD DVD-R) version 1.0) by using an optical disc evaluation device ODU-1000 (wavelength: 405 nm, NA: 0.65) manufactured by Pulstec Industrial Co., Ltd. with respect to this recordable optical recording medium. Example 27 is an example wherein at least a first protection layer, a recording layer, a second protection layer, and a reflection layer are sequentially deposited over the substrate, the thickness of the first protection layer being set to 10 nm to 80 nm, the thickness of the recording layer being set to 6 nm to 30 nm, the thickness of the second protection layer being set to 8 nm to 35 nm, and the thickness of the reflection layer being set to 20 nm to 100 nm. FIG. 8 shows a value of PRSNR of the optical recording medium in which the recording layer was formed to a thickness of 17 nm, the second protection layer was formed to a thickness of 20 nm, and the reflection layer was formed to a thickness of 40 nm by changing the thickness of the first protection layer serving as a ZnS—SiO$_2$ layer. Values of PRSNR in the vicinity of 60 nm show the highest value. FIG. 9 shows a value of PRSNR of the optical recording medium in which the ZnS—SiO$_2$ layer serving as the first protection layer is formed to a thickness of 60 nm, the thickness of the recording layer was changed, the second protection layer was changed to a thickness of 20 nm, and the reflection layer was formed to a thickness of 40 nm. Values of PRSNR in the vicinity of 17 nm show the highest values. FIG. 10 shows a value of PRSNR of the optical recording medium in which the ZnS—SiO$_2$ layer serving as the first protection layer is formed to a thickness of 60 nm, the recording layer was formed to a thickness of 15 nm, the thickness of the second protection layer was changed, and the reflection layer was formed to a thickness of 40 nm. Values of PRSNR in the vicinity of 20 nm show the highest values. Furthermore, FIG. 11 shows the values of PRSNR before the storage test and after 200 hour-storage test. There was a difference depending on the thickness of the first protection layer. In the case where the first protection layer was 0 nm, the reduction in the PRSNR value was large. However, in the protection layer with a thickness of 10 nm or 30 nm, the reduction in the PRSNR value was suppressed; this means such thickness values were effective. FIG. 12 shows a relationship between the thickness of the reflection layer and the PRSNR. The ZnS—SiO$_2$ layer serving as the first protection layer was formed to a thickness of 60 nm, the recording layer was formed to a thickness of 17 nm, and the second protection layer was formed to a thickness of 20 nm. Values of PRSNR in the vicinity of 40 nm show favorable characteristics.

Example 28

Figure 13:
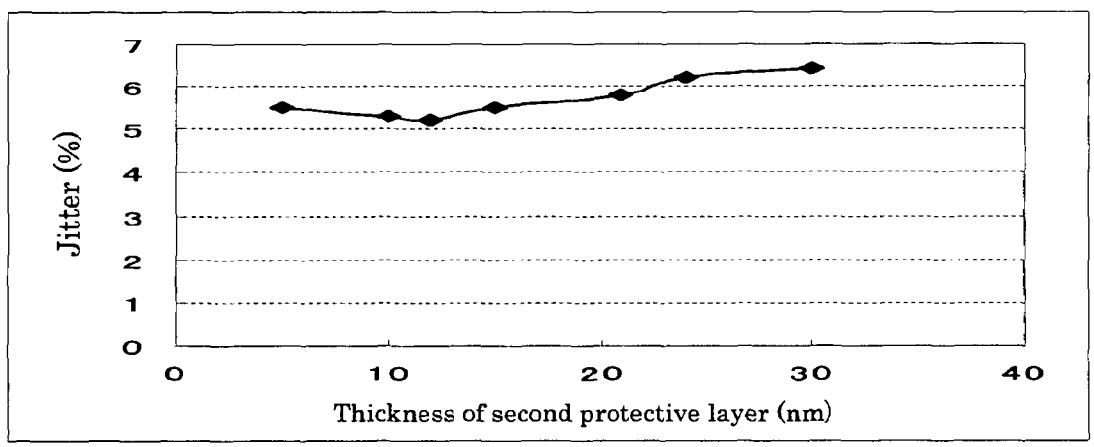
FIG. 13 is a graph of thickness of the second protection layer vs. jitter value.
Figure 14:
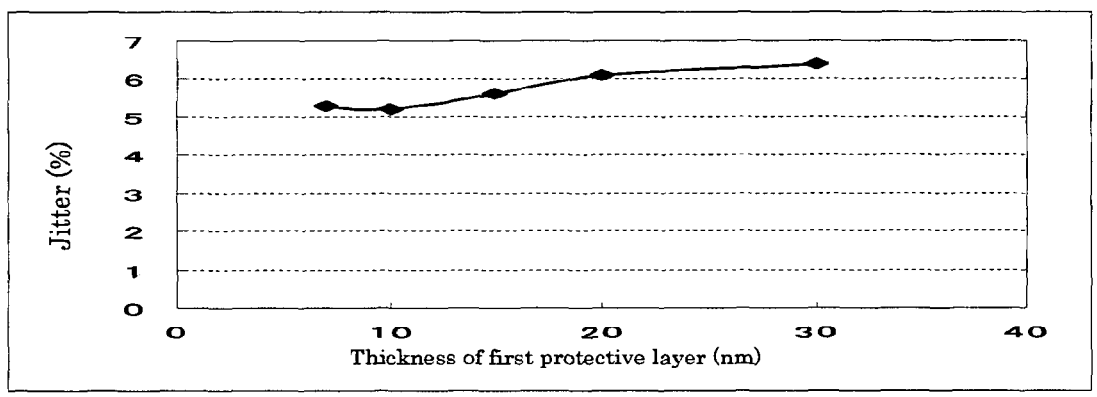
FIG. 14 is a graph of thickness of the first protection layer vs. jitter value.
Figure 15:
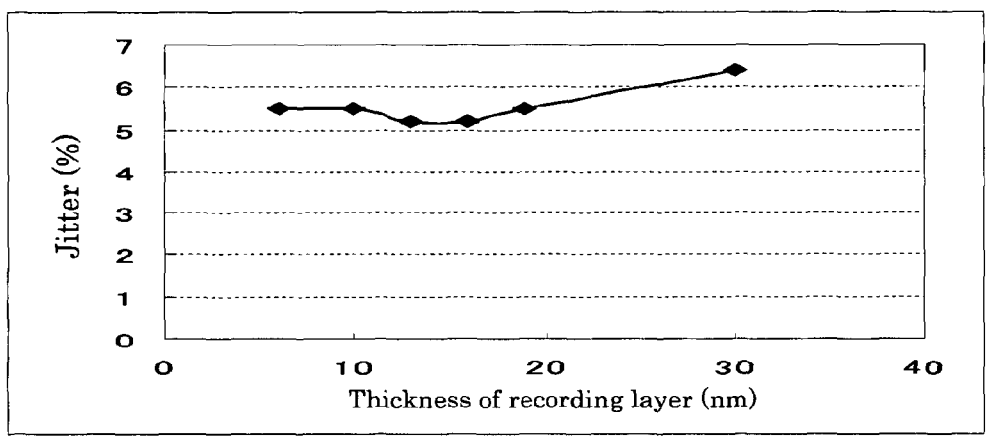
FIG. 15 is a graph of thickness of the recording layer vs. jitter value.

On a polycarbonate substrate (product name: ST3000 manufactured by Teijin Beyer Polytec Co., LTd.) having a guide groove (with a groove depth of 21 nm and a track pitch of 0.32 μm), by using the sputtering method, a thickness of 1.1 mm and a diameter of 120 nm, an AlTi alloy (Ti: 1.0 weight %) layer serving as the reflection layer, a silicon nitride layer serving as the second protection layer, a layer (Bi—B—O layer) comprising Bi, B and oxygen and serving as the recording layer, a ZnS—SiO$_2$ (80:20 mol %) layer serving as the first protection layer were sequentially provided followed by laminating thereon a polycarbonate sheet (manufactured by Teijin Kasei; Pure Ace) to a thickness of 75 μm by using a UV curable resin ((manufactured by Nippon Kayaku; DVD003) to provide a light transmitting layer to prepare a recordable optical recording medium of the present invention having a thickness of 1.2 mm (a recordable optical recording medium corresponding to the standard of a so-called blue-ray disc). Recording was conducted in a condition in conformity with the standard of the recordable Blu-ray disc (BD-R version 1.1) by using an optical disc evaluation device ODU-1000 (wavelength: 405 nm, NA: 0.85) manufactured by Pulstec Industrial Co., Ltd. with respect to this recordable optical recording medium to evaluate the recording characteristics. Example 28 is an example wherein at least a reflection layer, a second protection layer, a recording layer, a first protection layer, and a cover layer are sequentially deposited over the substrate, the first protection layer having a thickness of 7 nm to 30 nm, the recording layer having a thickness of 6 nm to 30 nm, the second protection layer having a thickness of 5 nm to 30 nm, and the reflection layer having a thickness of 30 nm to 80 nm. FIG. 13 shows a result obtained by forming the reflection layer to a thickness of 35 nm, the recording layer to a thickness of 16 nm and the first protection layer to a thickness of 10 nm and changing the thickness of the second protection layer. Values of jitter in the vicinity of 10 nm to 12 nm show the most favorable characteristics. FIG. 14 shows the result obtained by forming the reflection layer to a thickness of 35 nm, the recording layer to a thickness of 16 nm, the second protection layer to a thickness of 12 nm and changing the thickness of the first protection layer. A thickness in the vicinity of 10 nm showed favorable characteristics. FIG. 15 shows the result obtained by forming the reflection layer to a thickness of 35 nm, the second protection layer to a thickness of 12 nm, the first protection layer to a thickness of 10 nm and changing the thickness of the recording layer. A thickness in the vicinity of 13 nm to 16 nm showed favorable characteristics.

What is claimed is:

1. A recordable optical recording medium, comprising:
a film which comprises as main components Bi, B and oxygen, the film being deposited by using a sputtering target which comprises Bi and B for preparing a recordable optical recording medium.

2. A recordable optical recording medium, comprising:
a substrate; and
a recording layer formed over the substrate, the recording layer containing at least Bi, B, and O as main components,
wherein the ratio of Bi to B in the recording layer is set to $3/7 \leq Bi/B \leq 8$.

3. The recordable optical recording medium according to claim 2, wherein the ratio of O to B in the recording layer is set to $2.2 \leq O/B \leq 13$.

4. The recordable optical recording medium according to claim 2, wherein the content of O in total elements in a range of 50% to 67% when expressed in atomic ration.

5. The recordable optical recording medium according to claim 2, wherein a protection layer is provided adjacent to both surfaces of the recording layer.

6. The recordable optical recording medium according to claim 2, wherein the protection layer comprises as a main component ZnS—SiO$_2$, silicon nitride, or aluminum oxide.

7. The recordable optical recording medium according to claim 2, wherein at least, a first protection layer, a recording layer, a second protection layer, and a reflection layer are sequentially deposited over the substrate, the first protection layer comprising aluminum oxide, the second protection layer comprising ZnS—SiO$_2$.

8. The recordable optical recording medium according to claim 2, wherein at least a reflection layer, a second protection layer, a recording layer, a first protection layer and a cover layer are sequentially deposited over the substrate, the second protection layer comprising silicon nitride, the first protection layer comprising ZnS—SiO$_2$.

9. The recordable optical recording medium according to claim 2, wherein the reflection layer comprises Al alloy.

10. The recordable optical recording medium according to claim 2, wherein at least a first protection layer, a recording layer, a second protection layer, and a reflective layer are sequentially deposited over the substrate, the thickness of the first protection layer being set to 10 nm to 80 mm, the thickness of the recording layer being set to 6 nm to 30 nm, the thickness of the second protection layer being set to 8 nm to 35 nm, and the thickness of the reflection layer being set to 20 nm to 100 nm.

11. The recordable optical recording medium according to claim 2, wherein at least a reflection layer, a second protection layer, a recording layer, a first protection layer, and a cover layer are sequentially deposited over the substrate, the first protection layer having a thickness of 7 nm to 30 nm, the recording layer having a thickness of 6 nm to 30 nm, the second protection layer having a thickness of 5 nm to 30 nm, and the reflection layer having a thickness of 30 nm to 80 nm.

12. The recordable optical recording medium according to claim 2, wherein the recording layer comprising Bi, B, and O comprises oxide which is in the state of oxygen deficiency in which oxygen is smaller in quantity than the stoichiometric composition.

13. The recordable optical recording medium according to claim 2, wherein the recording layer comprising Bi, B, and O comprises Bi oxide which is in the state of oxygen deficiency in which oxygen is smaller in quantity than the stoichiometric composition.

14. The recordable optical recording medium according to claim 2, wherein a recording mark recorded by light application contains a single element rather than an oxide thereof.

15. The recordable optical recording medium according to claim 2, wherein the recording mark recorded by light application shows no distinct crystal structures.

* * * * *